US006512388B1

(12) United States Patent
Satoh et al.

(10) Patent No.: US 6,512,388 B1
(45) Date of Patent: Jan. 28, 2003

(54) IC SOCKET AND SPRING MEANS OF IC SOCKET

(75) Inventors: Shuichi Satoh, Tokyo (JP); Tomoyoshi Yamaguchi, Urawa (JP)

(73) Assignee: Enplas Corporation, Saitama (JP)

( * ) Notice: Subject to any disclaimer, the term of this patent is extended or adjusted under 35 U.S.C. 154(b) by 20 days.

(21) Appl. No.: 09/597,033

(22) Filed: Jun. 20, 2000

(30) Foreign Application Priority Data

Jun. 25, 1999 (JP) .......................................... 11-180971

(51) Int. Cl.[7] .............................................. G01R 31/02
(52) U.S. Cl. ...................................... 324/755; 324/762
(58) Field of Search ................................ 324/754, 755, 324/758, 765, 158.1, 762; 439/70–72, 264, 331, 68

(56) References Cited

U.S. PATENT DOCUMENTS

| 5,402,077 A | * | 3/1995 | Agahdel et al. | ......... 324/158.1 |
| 5,407,361 A | * | 4/1995 | Ikeya | .......................... 439/331 |
| 5,468,157 A | * | 11/1995 | Roebuck et al. | ............. 439/264 |
| 5,518,410 A | * | 5/1996 | Masami | ....................... 324/761 |
| 5,829,988 A | * | 11/1998 | McMillan et al. | ........... 439/331 |
| 6,174,173 B1 | * | 1/2001 | Fukunaga | ..................... 439/68 |

\* cited by examiner

*Primary Examiner*—Michael Sherry
*Assistant Examiner*—Minh N. Tang
(74) *Attorney, Agent, or Firm*—Bachman & LaPointe, P.C.

(57) ABSTRACT

An IC socket with good durability that permits electrical tests on IC to be performed accurately over a long period of time is provided. An elastically deformable metal plate 12 is fixed within a spring accommodating portion 9 of a support board 2. The metal plate 12 is such that a plurality of spiral cantilevers 19 are formed so as to correspond to bumps 21 of the IC 10, and the flat tip 19a of the spiral cantilever supports an insulative resin film 3. When the IC 10 is pressed by an IC pressing part 54 and the bump 21 of the IC 10 flexibly deforms the spring part S via the insulative resin film 3, a contact pressure due to the elastic force of the spring part S occurs in the contact area between the bump 21 and contact pad 11.

14 Claims, 19 Drawing Sheets

PRIOR ART

IC SOCKET AND SPRING MEANS OF IC SOCKET

BACKGROUND OF THE INVENTION

1. Field of the Invention

The present invention relates to IC sockets used for burn-in tests on ICs, such as BGA and LGA, where terminals are formed on a top or bottom surface of their package.

2. Description of the Prior Art

The applicant of the present application have invented an IC socket 100 as depicted in FIGS. 37–38 and filed a patent application (see Japanese Patent Application No. Hei. 10-62228 (62228: of 1998)). This IC socket 100 includes an insulative resin film 103 where a circuit pattern (not shown) corresponding to a bump (solder ball) 102 of an IC 101 is formed; a support board 104 made of an insulative resin for supporting the insulative resin film 103; and a terminal pin unit 105 having its top end connected to said circuit pattern and its bottom end connected to an electrical test circuit (not shown). On the back side of the insulative resin film 103 having the IC 101 disposed thereon is placed a silicone rubber plate 106. And a pressure member 107 is pivotally attached via a socket body 108 to the top surface of the support board 104.

The IC socket as described above is such that when the IC 101 is pressed downward by the pressure member 107, the bump 102 of the IC 101 elastically deforms (dents) the silicone rubber plate 106, so that the elastic restoring force of the silicone rubber plate 106 permits the bump 102 of the IC 101 and the circuit pattern to come into contact with a desired contact pressure. The IC socket 100 electrically connects the IC 101 and external electrical test circuit (not shown) via the terminal pin unit 105 and circuit pattern, thereby allowing for accurate burn-in tests and so forth.

However, with the above IC socket 100, if burn-in tests and so forth are repeated at temperatures of about 150° C., the elastic restoring force of the silicone rubber plate 106 degrades, thereby. possibly reducing the contact stability between the bump 12 and circuit pattern. Accordingly, it is desired that an IC socket with greater, durability be provided.

SUMMARY OF THE INVENTION

The present invention is invented to meet the market requirements as described above, and the object of the present invention is to provide an IC socket with superior durability that can maintain contact stability between the bump and circuit pattern even after it is repeatedly used more frequently than the prior IC socket.

A first aspect of the present invention is an IC socket, which comprises: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface opposite to a surface where said contact pads of the insulative resin film are formed; an IC pressing means, attached to said support board to press the IC terminals against the contact pads of said insulative resin film; and a spring means for pressing said contact pads against said IC terminals pressed by said IC pressing means. Further, said spring means comprises a spiral cantilever formed in an elastically deformable metal plate fixed to the surface of said support board opposite to said insulative resin film. The tip of this spiral cantilever presses said contact pad against said IC terminal via said insulative resin film.

A second aspect of the present invention is such that said spiral cantilever is formed so that its height increases toward its tip according to the first aspect of the invention.

A third aspect of the present invention is such that the tip of said spiral cantilever is formed to be flat according to the second aspect of the invention.

A fourth aspect of the present invention is such that said spiral cantilever has a dome formed on its tip, said dome protruding toward said insulative resin film, and an escape hole that allows flexible deformation of said spiral cantilever is formed on the surface of said support board opposite to said insulative resin film according to the first aspect of the invention.

A fifth aspect of the present invention is an IC socket, which comprises: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface of said insulative resin film opposite to a surface where said contact pads are formed; an IC pressing means, attached to said support board to press the IC terminals against the contact pads of said insulative resin film; and a spring means for pressing said contact pads against said IC terminals pressed by said IC pressing means. Said spring means comprises a cantilever that is cut and raised from an elastically deformable metal plate fixed to the surface of said support board opposite to said insulative resin film, and the tip of the cantilever presses said contact pad against said IC terminal via said insulative resin film.

A sixth aspect of the present invention is such that said metal plate consists of a first metal plate where odd rows of cantilevers are formed and a second metal plate where even rows of cantilever are formed according to the fifth aspect of the invention.

A seventh aspect of the present invention is an IC socket, which comprises: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface opposite to a surface where said contact pads of the insulative resin film are formed; an IC pressing means, attached to said support board to press the IC terminals against the contact pads of said insulative resin film; and a spring means for pressing said contact pads against said IC terminals pressed by said IC pressing means. Said spring means is such that a plate-shaped member is cut and raised from an elastically deformable metal plate fixed to the surface of said support board opposite to said insulative resin film, the tip of the plate-shaped member is formed so that it can slide over said support board, a curved portion that protrudes toward said insulative resin film is bent and formed between the tip and root of the plate-shaped member, and the crest of the curved portion presses said contact pad against said IC terminal via said insulative resin film.

An eighth aspect of the present invention is an IC socket, which comprises: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface of said insulative resin film opposite to a surface where said contact pads are formed; an IC pressing means, attached to said support board to press the IC terminals against the contact pads of said insulative resin film; and a spring means for pressing said contact pads against said IC terminals pressed by said IC pressing means. Said spring means comprises an opposing pair of cantilevers that are cut and raised from an elastically deformable metal plate fixed to the surface of said support board opposite to said insulative resin film. The tips of this pair of cantilevers press said contact pad against said IC terminal via said insulative resin film.

A ninth aspect of the present invention is an IC socket, which comprises: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface of said insulative resin film opposite to a surface where said contact pads are formed; an IC pressing means, attached to said support board to press the IC terminals against the contact pads of said insulative resin film; and a spring means for pressing said contact pads against said IC terminals pressed by said IC pressing means. Said spring means comprises a pair of plate-shaped members that are cut and raised, so as to extend in opposite directions to each other, from an elastically deformable metal plate fixed to the surface of said support board opposite to said insulative resin film. The tips of this pair of plate-shaped members are formed so that they can slide over said support board, and a curved portion that protrudes toward said insulative resin film is bend and formed between the tip and root thereof. The crests of the pair of curved portions press said contact pad against said IC terminal via said insulative resin film.

A tenth aspect of the present invention is an IC socket, which comprises: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface of said insulative resin film opposite to a surface where said contact pads are formed; an IC pressing means, attached to said support board to press the IC terminals against the contact pads of said insulative resin film; and a spring means for pressing said contact pads against said IC terminals pressed by said IC pressing means. Said spring means comprises a plate-shaped member that is cut and raised from an elastically deformable metal plate fixed to the surface of said support board opposite to said insulative resin film. This plate-shaped member has a raised portion that is raised toward said insulative resin film and a spring action portion that extends further beyond said raised portion toward said insulative resin film. The tip of the spring action portion presses said contact pad against said IC terminal via said insulative resin film.

An eleventh aspect of the present invention is an IC socket, which comprises: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface of said insulative resin film opposite to a surface where said contact pads are formed; an IC pressing means, attached to said support board to press the IC terminals against the contact pads of said insulative resin film; and a spring means for pressing said contact pads against said IC terminals pressed by said IC pressing means. Said spring means comprises a plurality of cantilevers that are cut and raised from an elastically deformable metal plate fixed to the surface of said support board opposite to said insulative resin film. The tips of those cantilevers press said contact pad against said IC terminal via said insulative resin film.

A twelfth aspect of the present invention is an IC socket spring means for use with an IC socket, said IC socket comprising: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface of said insulative resin film opposite to a surface where said contact pads are formed; and an IC pressing means, attached to said support board to press the IC terminals against the contact pads of said insulative resin film; wherein said IC socket spring means presses said contact pads against said IC terminals pressed by said IC pressing means. A spiral cantilever is formed in an elastically deformable metal plate fixed to the surface of said support board opposite to said insulative resin film, and the tip of the spiral cantilever presses said contact pad against said IC terminal via said insulative resin film.

A thirteenth aspect of the present invention is such that said spiral cantilever is formed so that its height increases toward its tip according to the twelfth aspect of the invention.

A fourteenth aspect of the present invention is such that the tip of said spiral cantilever is formed to be flat according to the thirteenth aspect of the invention.

A fifteenth aspect of the present invention is such that a dome that protrudes toward said insulative resin film is formed on the tip of said spiral cantilever, and said spiral cantilever may flexibly deform within an escape hole formed on the surface of said support board opposite to said insulative resin film according to the twelfth aspect of the invention.

A sixteenth aspect of the present invention is an IC socket spring means for use with an IC socket, said IC socket comprising: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface of said insulative resin film opposite to a surface where said contact pads are formed; and an IC pressing means, attached to said support board to press the IC terminals against the contact pads of said insulative resin film; wherein said IC socket spring means presses said contact pads against said IC terminals pressed by said IC pressing means. A cantilever is cut and raised from an elastically deformable metal plate fixed to the surface of; said support board opposite to said insulative resin film, and the tip of the cantilever presses said contact pad against said IC terminal via said insulative resin film.

A seventeenth aspect of the present invention is such that said metal plate consists of a first metal plate where odd rows of cantilevers are formed and a second metal plate where even rows of cantilever are formed according to the sixteenth aspect of the invention.

An eighteenth aspect of the present invention is an IC socket spring means for use with an IC socket, said IC socket comprising: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface of said insulative resin film opposite to a surface where said contact pads are formed; and an IC pressing means, attached to said support board to press the IC terminals against the contact pads of said insulative resin film; wherein said IC socket spring means presses said contact pads against said IC terminals pressed by said IC pressing means. A plate-shaped member is cut and raised from an elastically deformable metal plate fixed to the surface of said support board opposite to said insulative resin film, the tip of the plate-shaped member is formed so that it can slide over said support board, a curved portion that protrudes toward said insulative resin film is bent and formed between the tip and root of the plate-shaped member, and the crest of the curved portion presses said contact pad against said IC terminal via said insulative resin film.

A nineteenth aspect of the present invention is an IC socket spring means for use with an IC socket, said IC socket comprising: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface of said insulative resin film opposite to a surface where said contact pads are formed; and an IC pressing means, attached to said support board to press the IC terminals against the contact pads of said insulative resin film; wherein said IC socket spring means presses said contact pads against said IC terminals pressed by said IC pressing means. An opposing pair of cantilevers are cut and raised from an elastically deformable metal plate fixed to the surface of said support board opposite to said insulative resin film, and the tips of this pair of cantilevers press said contact pad against said IC terminal via said insulative resin film.

A twentieth aspect of the present invention is an IC socket spring means for use with an IC socket, said IC socket comprising: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface of said insulative resin film opposite to a surface where said contact pads are formed; and an IC pressing means, attached to said support board to press the IC terminals against the contact pads of said insulative resin film; wherein said IC socket spring means presses said contact pads against said IC terminals pressed by said IC pressing means. A pair of plate-shaped members are cut and raised, so as to extend in opposite directions to each other, from an elastically deformable metal plate fixed to the surface of said support board opposite to said insulative resin film. The tips of this pair of plate-shaped members are formed so that they can slide over said support board, and a curved portion that protrudes toward said insulative resin film is bent and formed between the tip and root thereof. The crests of that pair of curved portions press said contact pad against said IC terminal via said insulative resin film.

A twenty-first aspect of the present invention is an IC socket spring means for use with an IC socket, said IC socket comprising: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface of said insulative resin film opposite to a surface where said contact pads are formed; and an IC pressing means, attached to said support board to press the IC terminals against the contact pads of said insulative resin film; wherein said IC socket spring means presses said contact pads against said IC terminals pressed by said IC pressing means. A plate-shaped member is cut and raised from an elastically deformable metal plate fixed to the surface of said support board opposite to said insulative resin film. This plate-shaped member has a raised portion that is raised toward said insulative resin film and a spring action portion that extends further beyond said raised portion toward said insulative resin film. The tip of the spring action portion presses said contact pad against said IC terminal via said insulative resin film.

A twenty-second aspect of the present invention is an IC socket spring means for use with an IC socket, said IC socket comprising: an insulative resin film that is elastically deformable, where a plurality of conductive contact pads are formed so as to correspond to a plurality of IC terminals and a circuit pattern is formed to electrically connect said contact pads and an external electrical test circuit; a support board that supports a surface of said insulative resin film opposite to a surface where said contact pads are formed; and an IC pressing means, attached to said support board to press the IC terminals against the contact pads of said insulative resin film; wherein said IC socket spring means presses said contact pads against said IC terminals pressed by said IC pressing means. A plurality of cantilevers are cut and raised from an elastically deformable metal plate fixed to the surface of said support board opposite to said insulative resin film, and the tips of those cantilevers press said contact pad against said IC terminal via said insulative resin film.

DESCRIPTION OF THE PREFERRED EMBODIMENTS

Embodiments of the present invention are described in detail below with reference to the drawings.

First Embodiment

Figure 1:
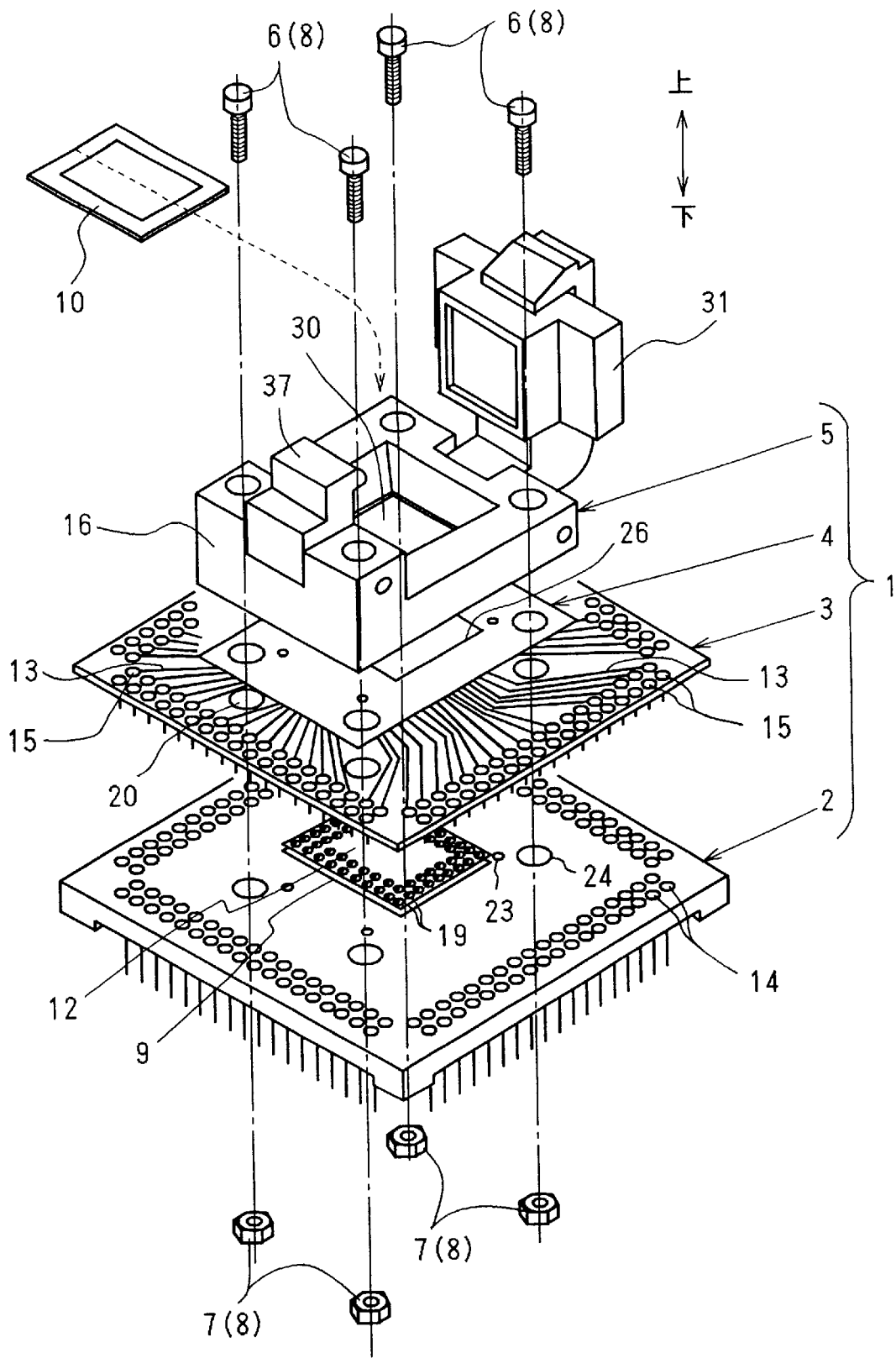
FIG. 1 is an exploded, perspective view of an IC socket according to a first embodiment of the present invention.
Figure 2:
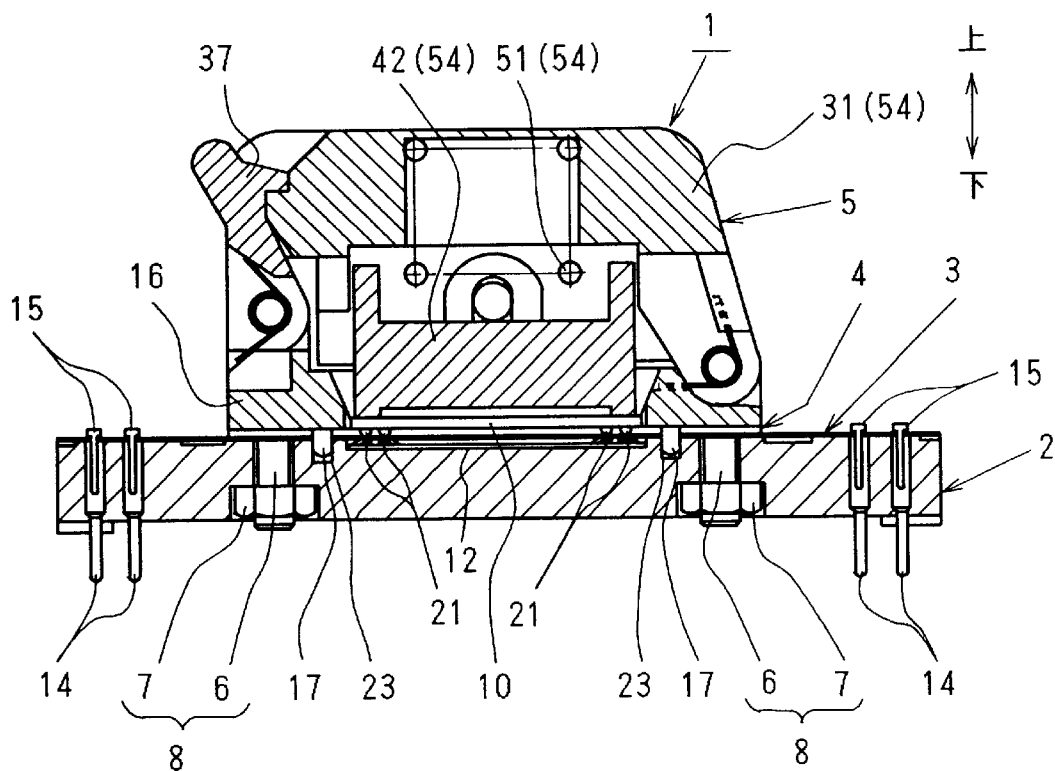
FIG. 2 is a front, side elevational cross-sectional view of the IC socket.
Figure 3:
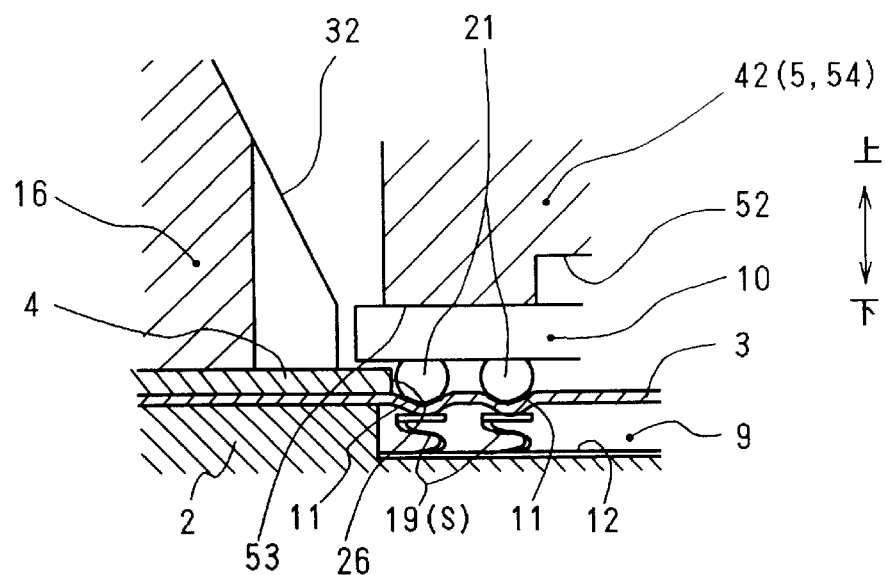
FIG. 3 is a partial enlarged view of FIG. 2.
Figure 4:
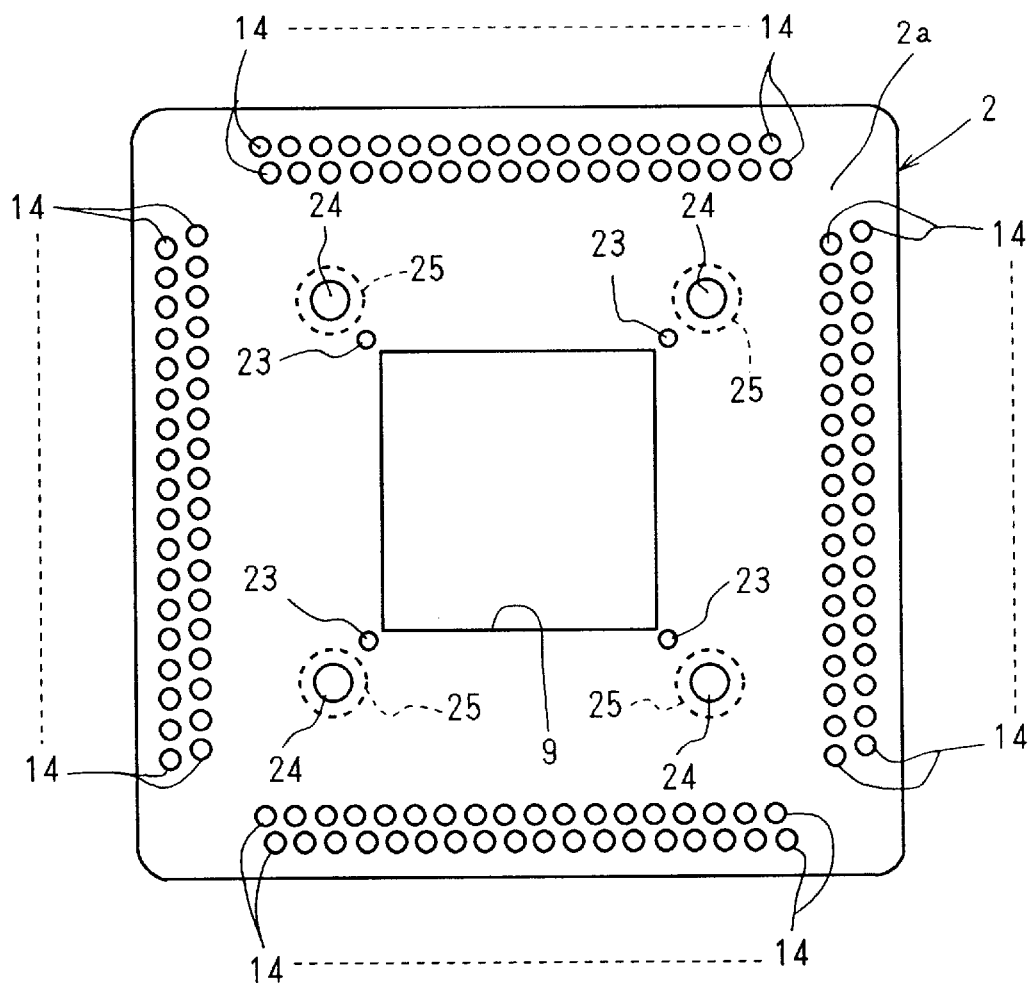
FIG. 4 is a plan view of a support board according to the first embodiment of the present invention.
Figure 5:
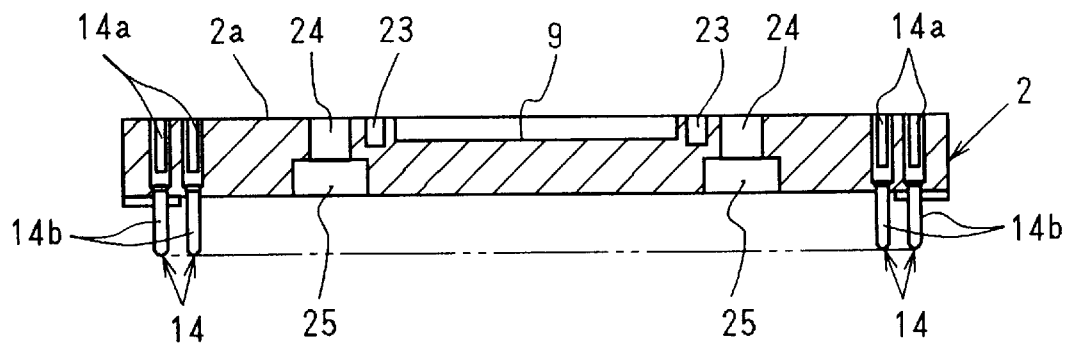
FIG. 5 is a cross-sectional view of the support board.

As shown in FIGS. 1—2, an IC socket 1 of the resent embodiment includes: a support board made of an insulative resin material (for example, polyether imide) in plate shape; a metal plate fixed onto the support board; an insulative resin film 3 superimposed over the metal plate and over said support board 2; a positioning film 4 superimposed over the insulative resin film 3; and a pressure jig 5 superimposed over the positioning film 4. It should be appreciated that said support board 2, insulative resin film 3, positioning film 4, and pressure jig 5 are collectively tightened in place by clamping means 8 comprised of screws 6 and nuts 7.

As shown in FIGS. 1, and 6 to 8, the insulative resin film 3 has a plurality of contact pads 11 formed on a top surface 3a so as to correspond to bumps (terminals) 21 of the IC 10, and also has a circuit pattern 13 formed thereon extending from the contact, pad 11 toward the outer periphery. At the ends of the circuit pattern 13 are fixed terminal pins 15 made of a conductive metal that extend downward through the insulative resin film and are engaged with the terminal socket 14 of the support board, which is described hereinafter (see FIG. 2). It should be appreciated that the insulative resin film 3 is formed by a resin material having heat resistance, durability, and elasticity, such as, for example, polyether imide, polyether sulfone, and polyphenylene sulfide.

Figure 6:
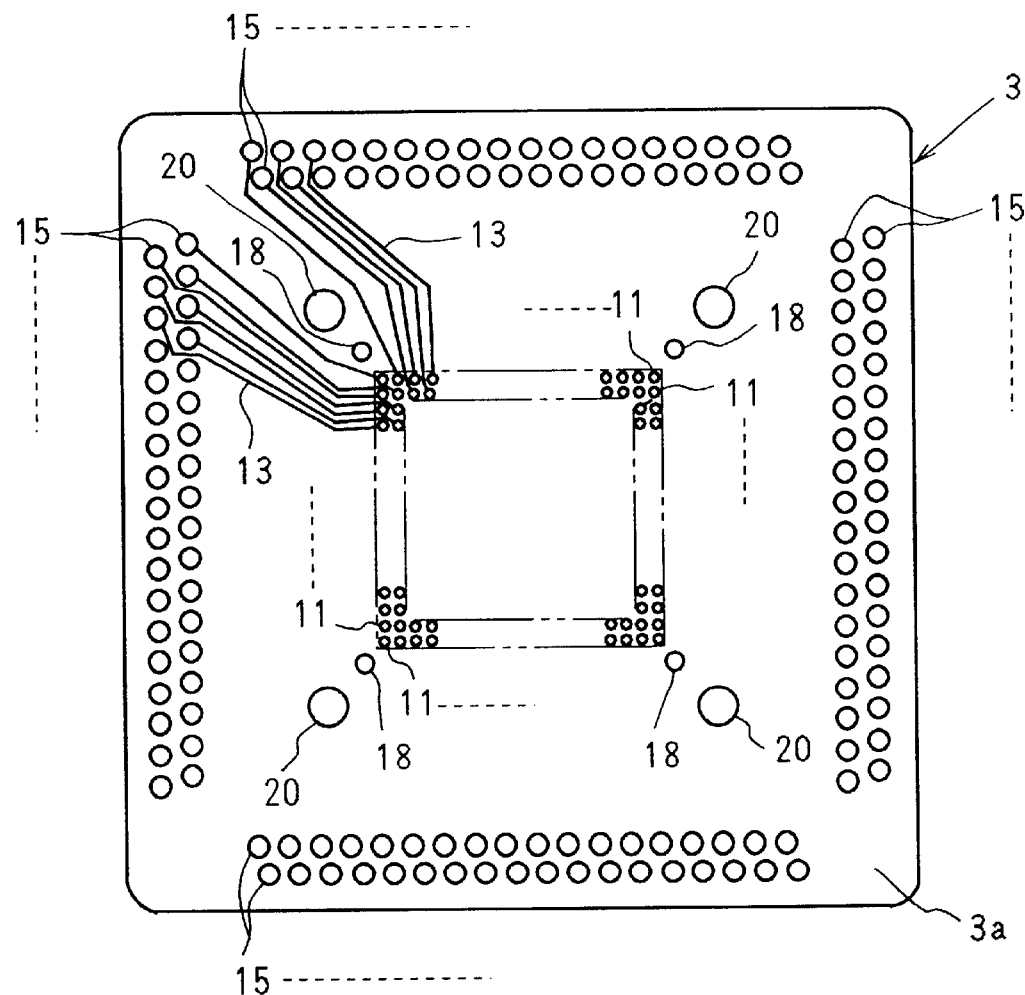
FIG. 6 is a plan view of an insulative resin film according to the first embodiment of the present invention.
Figure 7:
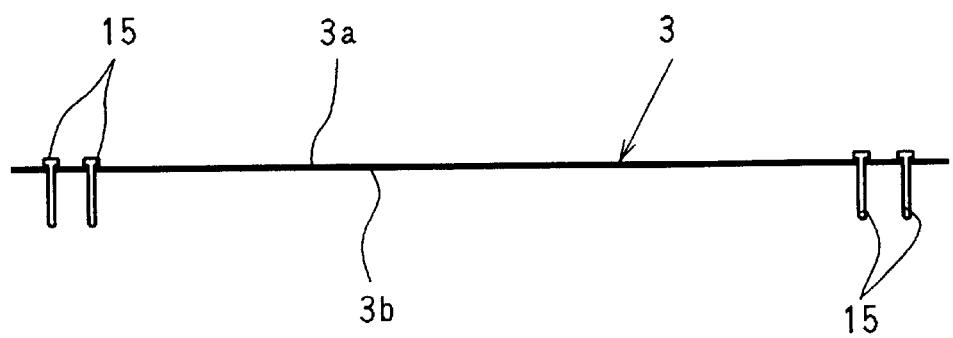
FIG. 7 is a cross-sectional view of the insulative resin film.
Figure 8:
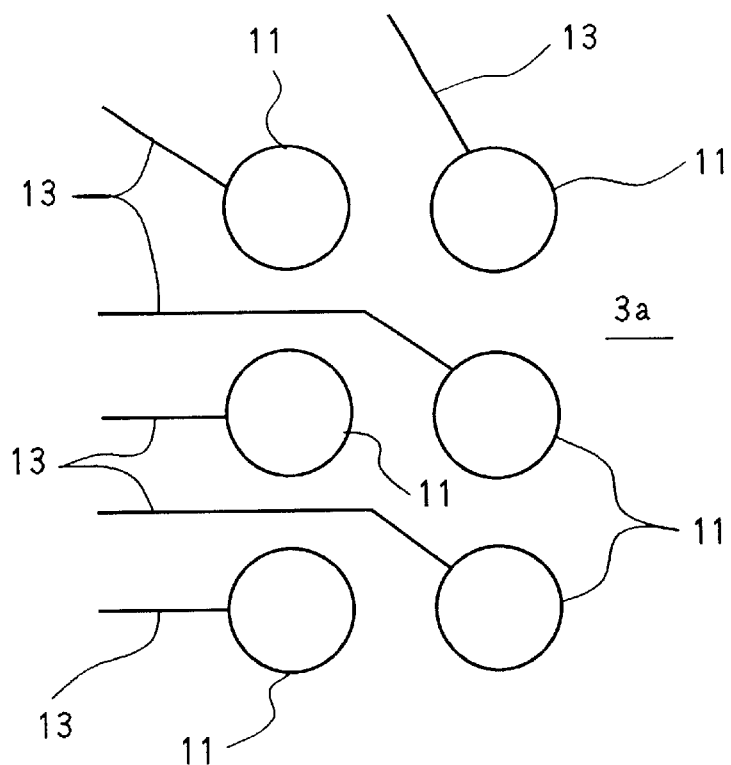
FIG. 8 is a partial enlarged view of FIG. 6.

Here, the contact pad 11 and circuit pattern 13 are formed by first disposing copper in a predetermined shape on the top surface 3a of the insulative resin film 3, then plating nickel over the copper, and further plating gold, rhodium, or solder over the nickel plating. Further, as shown in FIG. 6, outside the contact pad 11 of the insulative resin film 3, four positioning holes 18 are formed to mate with the positioning ribs 17 on the bottom surface of the socket body 16. Furthermore, outside the positioning holes 18, four holes for accepting the shafts of the screws 6 are formed. It should be appreciated that all the contact pads 11 in FIG. 6, to which one end of the circuit pattern 13 is connected as shown in FIG. 8, is connected to each of the terminal pins 15 via this circuit pattern 13.

As shown in FIGS. 1 to 5, the support board 2 has a spring accommodating portion 9 formed therein to accommodate an elastically deformable metal plate 12 at a position corresponding to the IC 10. The spring accommodating portion 9 is a rectangular recessed portion formed on the top surface of the support board 2, in which the metal plate 12 is fixed by adhesives or screws (not shown). Here, as shown in FIGS. 3 and 14 to 16 the metal plate 12 has spiral cantilevers (spring means) 19 formed at positions corresponding to a plurality of bumps 21 of the IC 10, wherein the spiral cantilever 19 is formed so that its height increases toward the tip 19a thereof. The tip 19a of the spiral cantilever 19 is formed to be flat, and this flat tip 19a presses the contact pad 11 against the bump 21 of the IC 10 via the insulative resin film 3. With such a spiral cantilever 19, because its beam length may be made longer than a straight cantilever counterpart, it is especially effective when the amount of elastic deformation is increased. Additionally, with such a spiral cantilever 19, because its tip 19 is flat and its area in contact with the insulative resin film 3 is increased accordingly, the bump 21 of the IC 10 and contact pad 11 may be contacted securely.

The support board 2 also has terminal sockets, 14 attached thereto for accommodating the terminal pins 15 at positions corresponding to the terminal pins 15 of the insulative resin film 3. The terminal socket 14 is made of a conductive metal, so. that the terminal pin 15 is engaged into the upper socket portion 14a, while the downwardly protruding pin 14b of the support board 2 is engaged into the attachment hole of the external electrical test circuit (not shown).

It should be appreciated that the support board 2 is formed in planar shape so that the top surface 2a can support. the back surface 3b of the insulative resin film 3 (see FIG. 7), and on this top surface 2a are formed four positioning holes 23 that correspond to the positioning ribs 17 on the bottom surface of the socket body 16. Further, outside the positioning holes 23 are formed four holes 24 and 25 to accommodate the screws 6 and nuts 7.

The positioning film 4 is formed of an insulative resin film, as shown in FIGS. 1–3 and FIG. 9, and has a rectangular, shaped hole 26 formed so as to surround the outermost bumps 21 of the bumps 21 of the IC 10, and this rectangular shaped hole 26 serves to align the IC 10 onto the insulative resin film 3.

Figure 9:
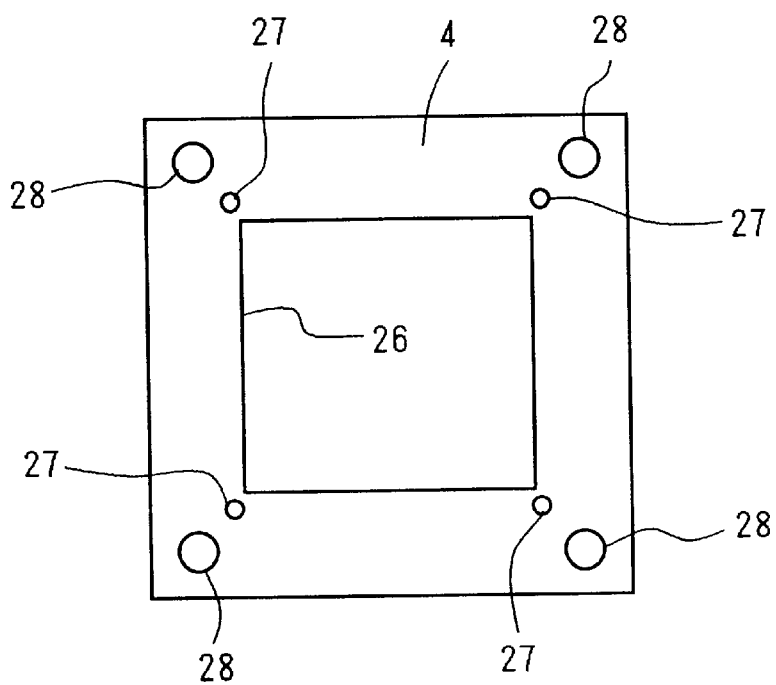
FIG. 9 is a plan view of a positioning film, depicting the first embodiment of the present invention.
Figure 10:
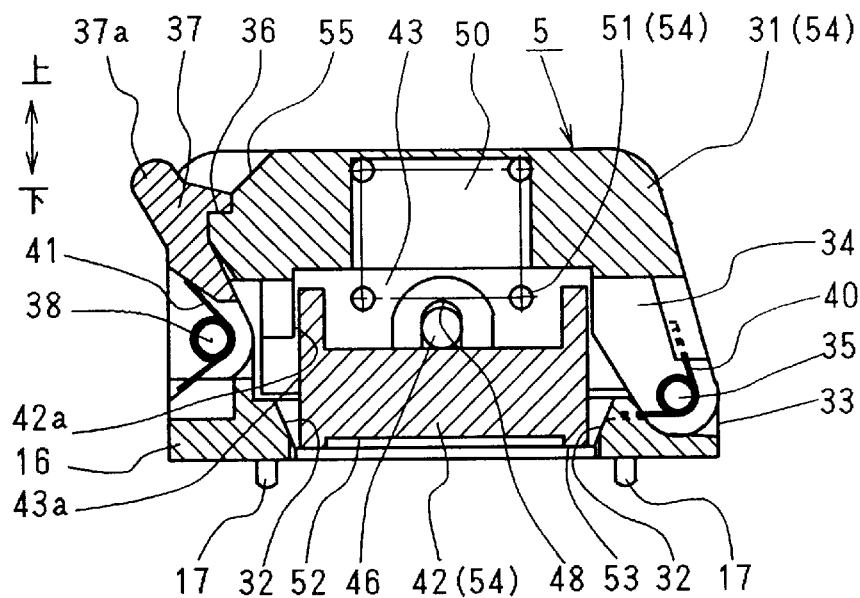
FIG. 10 is a cross-sectional view (a cross sectional view along line A—A of FIG. 12) of a pressure jig, depicting the first embodiment of the present invention.

It should be appreciated that this positioning film 4 also has four positioning holes 27 corresponding to the positioning ribs 17 on the bottom surface of the socket body 16, and outside the positioning holes 27 are formed four holes 28 for accommodating the screws 6 (see FIGS. 9 and 10).

The pressure jig 5 has the socket body 16 fixed onto the support board 2 via the insulative resin film 3 and positioning film 4, and a cover 31 that is pivotally attached to the socket body 16 to open and close a rectangular shaped IC acceptance port 30 of the socket body 16, as shown in FIGS. 1–3 and FIGS. 10–13.

Of them, the socket body 16 has the positioning ribs 17 formed on the bottom surface thereof, as described above, and the positioning ribs 17 are engaged into the positioning holes 27 of the positioning film 4, into the positioning holes 18 of the insulative resin film 3, and into the positioning holes of the support board 2, thereby ensuring alignment of the socket body 16 itself, positioning film 4, and insulative resin film 3 to the support board 2. Further, the socket body 16 also has guide walls 32 formed at four corners of the rectangular shaped IC acceptance port 30 to guide the IC 10 to a predetermined position over the positioning film 4 and insulative resin film 3. The guide walls 32 are sloped so as to increasingly widen the IC acceptance port 30 upward, thereby ensuring smooth guidance of the IC 10. Here, the guide walls 32 and positioning film 4 serve as positioning means to align the IC in place.

On one side of the socket body 16 is formed a cover attachment portion 33 for pivotally attaching the cover 31. To the, cover attachment portion 33 is attached an arm 34 of the cover 31 so that it may be pivoted via a pivot shaft 35. Furthermore, on the other side of the socket body 16 is attached a hook 37 that engages with a stepped portion 36 of the cover 31, so that it may be pivoted via a pivot shaft 38. It should be appreciated that the cover 31 is constantly loaded by a spring 40 in the clockwise direction (open direction) in FIGS. 10 and 11. The hook 37 is constantly loaded by a spring 41 in the clockwise direction (in the direction to close the cover 31) in FIGS. 10 and 11.

Figure 11:
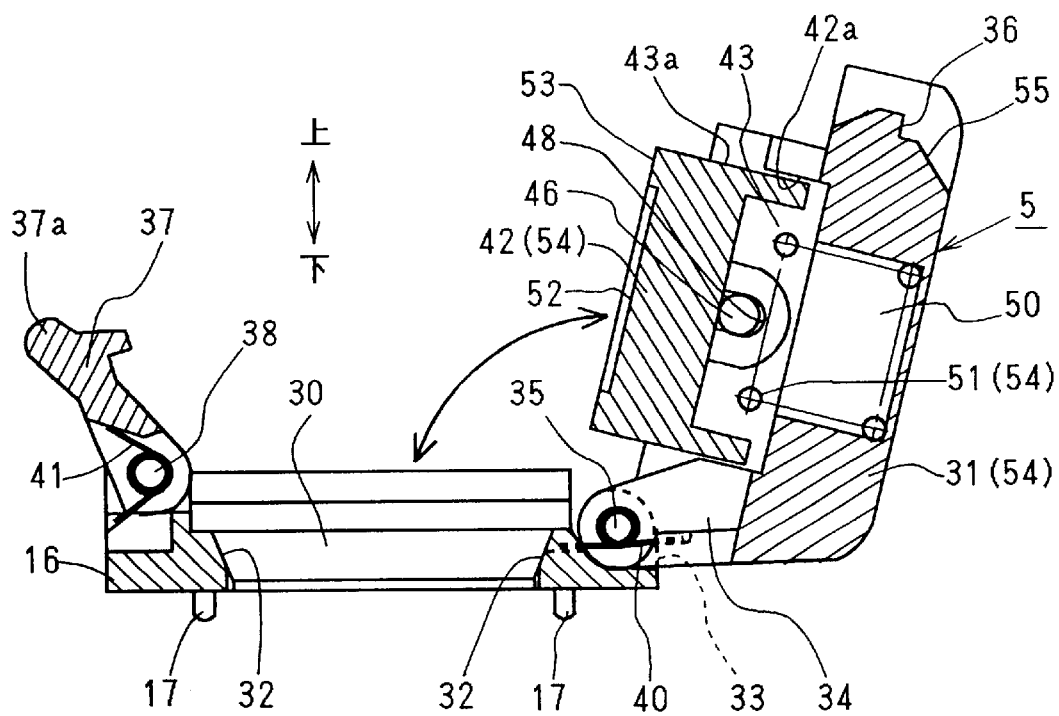
FIG. 11 is diagram depicting the state where the cover of the pressure jig is opened.
Figure 12:
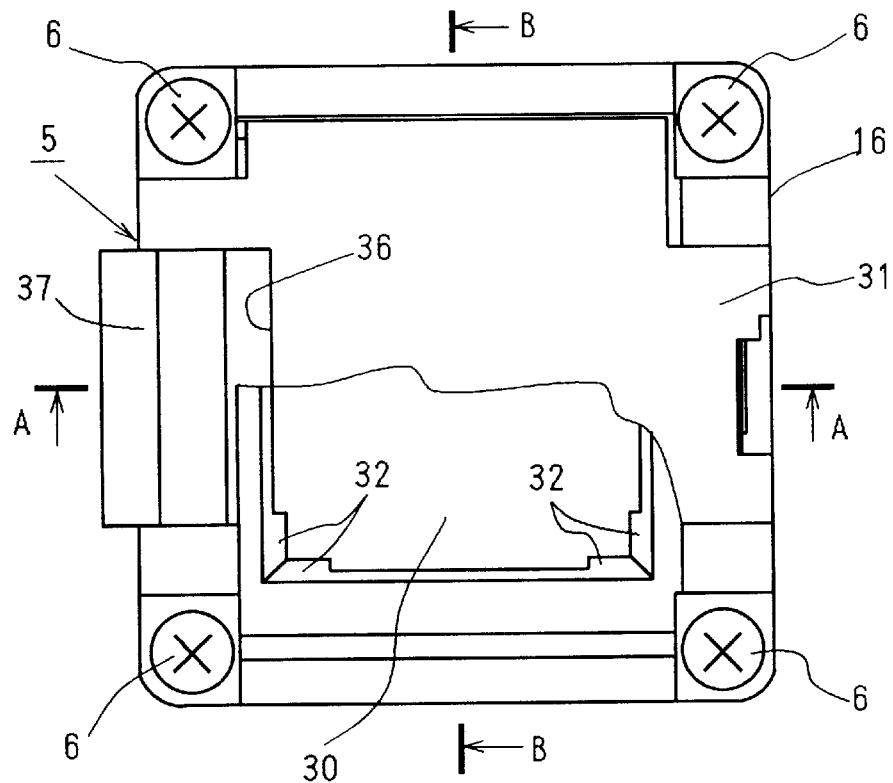
FIG. 12 is a plan view depicting the pressure jig in partial cutaway view.
Figure 13:
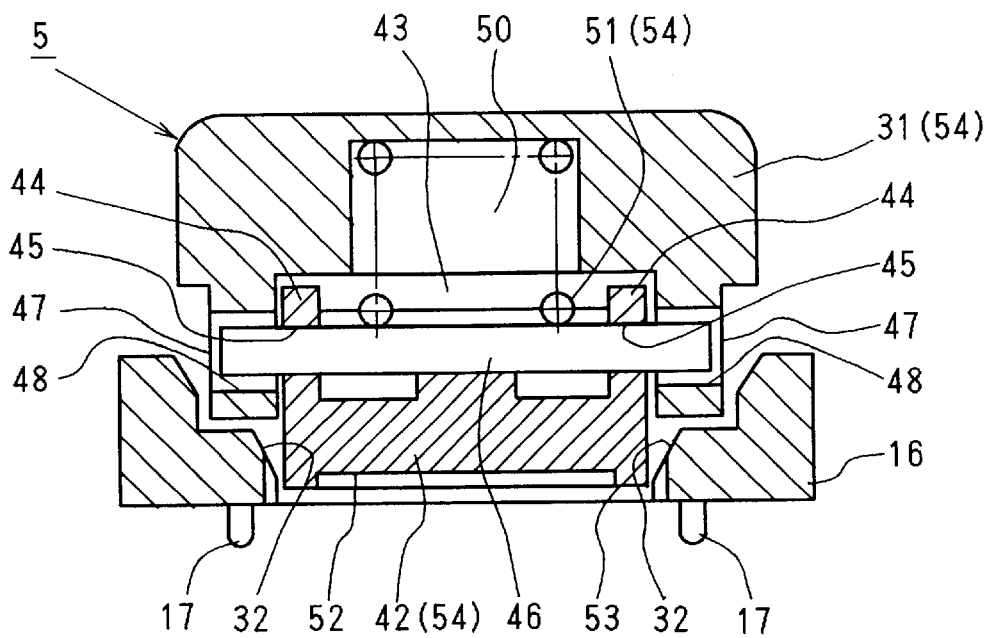
FIG. 13 is a cross-sectional view along line B—B of FIG. 12.
Figure 14:
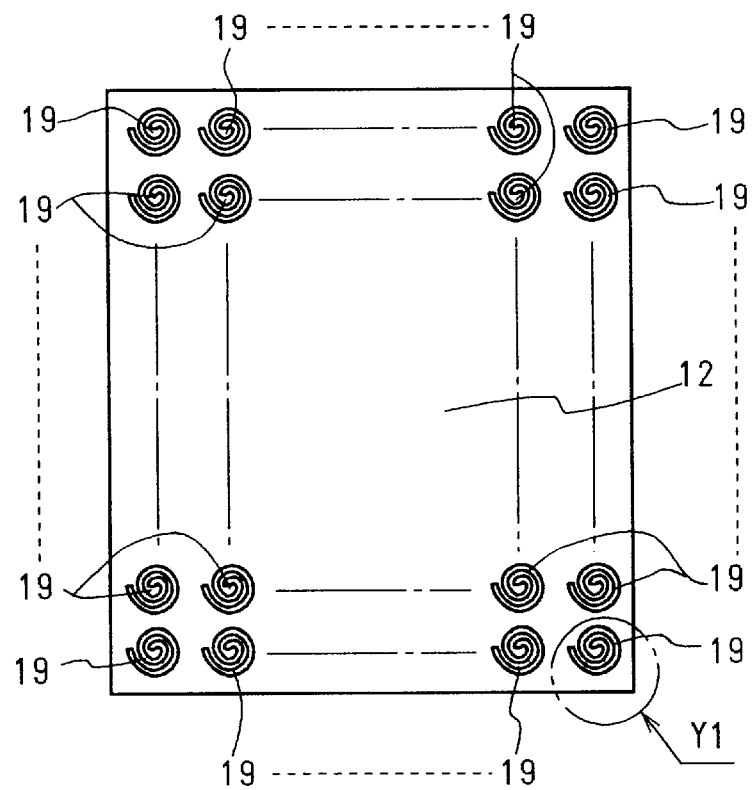
FIG. 14 is a plan view depicting a metal plate according to the first embodiment of the present invention.
Figure 15:
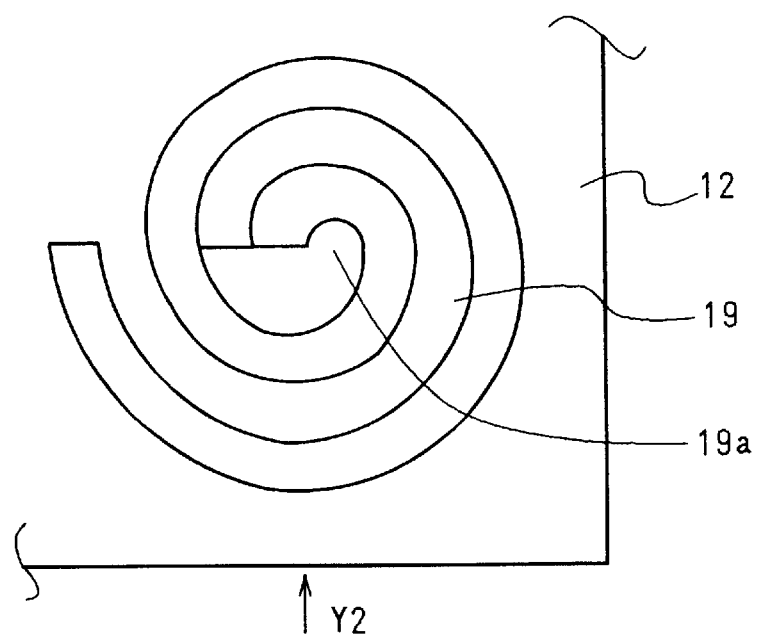
FIG. 15 is a partial enlarged view of FIG. 14 (where Y1 portion of the FIG. 14 is enlarged).
Figure 16:
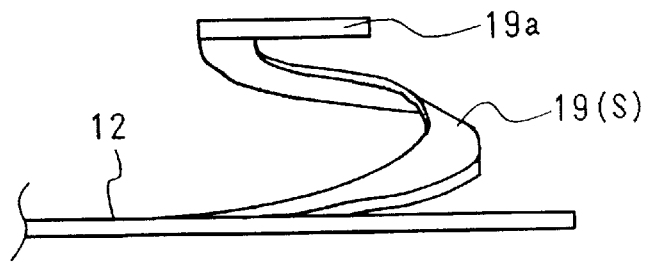
FIG. 16 is a front view depicting the metal plate according to the first embodiment of the present invention (as seen from Y2 direction of FIG. 15).

An IC pressure block 42 is attached to the cover 31. The IC pressure block 42 is slidably accommodated within a block accommodating recessed portion 43 formed on the bottom surface of the cover 31, as shown in FIGS. 10, 11, and 13, where a shaft 46 is fitted into an attachment hole 45 of tongues 44 formed in pair on both sides of the top, and both ends of the shaft 46 are slidably engaged into the slotted holes (sleeves) 48 of side walls 47 of the block accommodating recessed portion 43, respectively. Further, above the block accommodating recessed portion 43 of the cover 31 is formed a spring accommodating hole 50, in which a compression coil spring 51 is accommodated. The compression coil spring 51 constantly loads the IC pressure block downward via the shaft 46 in FIGS. 10 and 13, and presses the bumps 21 of the IC 10 against the contact pads 11 of the insulative resin film via the IC pressure block 42, thereby contacting the bumps 21 and contact pads 11 with a desired contact pressure (see FIG. 3).

Here, under condition where the cover 31 is opened, the IC pressure block 42 causes the shaft 46 to be pressed by the compression coil spring 51 and come into contact with the bottom end of the sleeve 48. When the cover 31 is closed, the IC pressure block 42 compresses the compression coil spring 51 to the thickness of the IC 10, so that the shaft 46 slides in the sleeve 48 and the side wall 42a of the IC pressure block 42 is guided to and slide against the side wall 43a of the block accommodating recessed portion 43.

It should be appreciated that the IC pressure block 42 has its bottom surface formed in rectangular shape to mate with the shape of the IC 10, and a rectangular shaped recessed portion 52 is formed in the bottom surface thereof, and outside this rectangular shaped recessed portion 52 is formed an IC pressure surface 53. This IC pressure surface 53 presses the top surface of the region corresponding to the bumps 21 of the IC 10 (see FIG. 3). Thus, the IC 10 is pressed by the IC pressure surface 53 of the IC pressure block 42, so that the bumps 21 of the IC 10 reliably contact the contact pads 11 of the insulative resin film 3. Here, the IC pressure means 54 is comprised of the cover 31, IC pressure block 42, and compression coil spring 51.

Further, a slope wall 55 is formed above the stepped portion 36 of the cover 31. Thus, sufficient space for manipulation of the hook 37 is secured near the manipulating portion 37a at the tip of the hook 37, so that the hook 37 may be mechanically or manually manipulated with ease.

With the IC socket so configured, when the hook 37 and the stepped portion 36 of the cover 31 are disengaged, the cover 31 is pivoted clockwise in FIG. 10 by the force of the spring 40, so that the IC acceptance port 30 of the socket body 16 is opened (see FIG. 11). The IC 10 is then inserted into the IC acceptance port 30 of the socket body 16 with the bumps 21 facing down (see FIGS. 1 and 3). Meanwhile, the IC 10 is guided along the guide walls 32 of the socket body 16 and placed in a predetermined position over the positioning film 4 and insulative resin film 3. The outermost ones of the bumps 21 of the IC 10 are aligned by the edge periphery of the rectangular shaped hole 26 of the positioning film 4 (see FIG. 3). As a result, the bumps 21 of the IC 10 are securely brought into contact onto the contact pads 11 of the insulative resin film 3.

After the IC 10 is accommodated into the socket body 16, the cover 31 is closed, and as the hook 37 is engaged with the stepped portion 36 of the cover 31, the cover 31 is locked to the upper portion of the socket 16. Then, the compression coil spring 51 is compressed to the thickness of the IC 10, and the spring force of the compression coil spring 51 acts on the IC 10 via the IC pressure block 42. As a result, the bumps 21 of the IC 10 press the insulative resin film toward the support board, thereby flexibly deforming the spiral cantilever (spring means S). That is, the bumps 21 of the IC 10 and the contact pads 11 are elastically sandwiched by the compression coil spring 51 and spiral cantilever 19, so that the bumps 21 of the IC 10 and the contact pads 11 are securely contacted. Here, because the spiral cantilever 19 is made of an elastically deformable metal, it has an outstandingly greater durability than a prior art silicone rubber plate when loading is repeatedly applied under a temperature condition of about 150° C.

With the present embodiment as described above, when the IC 10 is pressed by the IC pressure means 54, the bumps 21 of the IC press the insulative resin film 3 toward the support board 2 to flexibly deform the spiral cantilever 19, and the resulting elastic force of the spiral cantilever 19 provides a contact pressure between the bumps 21 and contact pads 11; even when burn-in tests or the like are performed repeatedly under a temperature condition of about 150° C., the metal-made spiral cantilever 19 will not lose its function as the spring means, so that electrical tests on the IC 10 can be performed accurately over a long period of time.

Additionally, according to the present embodiment, because a plurality of spiral cantilevers 19 are formed in the elastically deformable metal plate 12 in correspondence with the bumps 21 of the IC 10, and because the metal plate 12 is accommodated in and feed to the spring accommodating portion 9 of the support board 2, the rectangular shaped spring accommodating portion 9 may merely be formed in the support board 2. That is, the present embodiment facilitates machining of the support board as compared to an situation where, for example, separate compression coil springs are arranged separately corresponding to a plurality of bumps 21 of the IC 10 and a plurality of holes for accommodating the compression coil springs are formed separately in the support board.

Furthermore, according to the present embodiment, because a plurality of spiral cantilevers 19 are formed in the elastically deformable metal plate 12 in correspondence with the bumps 21 of the IC 10, as described above, the parts count can be reduced to facilitate parts control, as compared to a situation where separate spring means are arranged to correspond to the bumps 21 of the IC 10.

Figure 17:
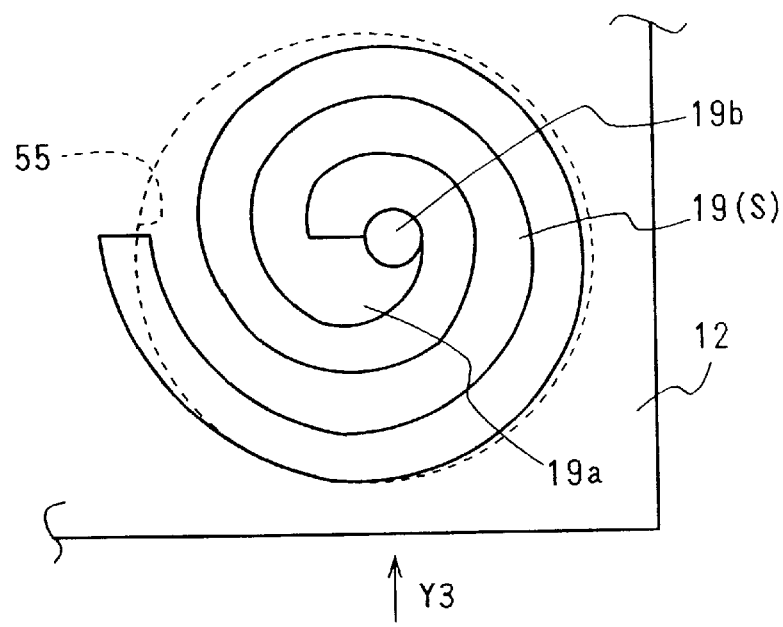
FIG. 17 is a plan view of a spiral cantilever according to the first embodiment of the present invention.
Figure 18:
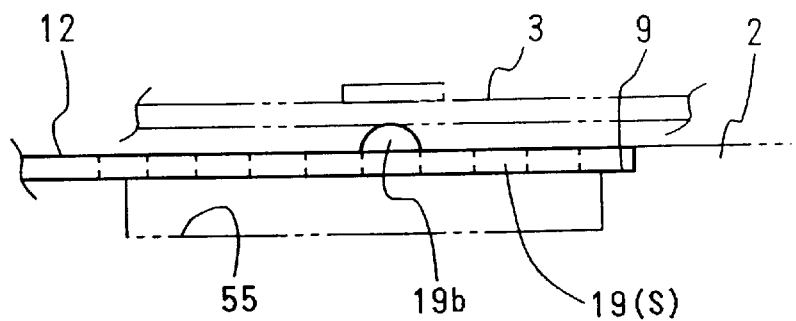
FIG. 18 is a front view of the spiral cantilever (as seen from Y3 direction of FIG. 17).

It should be appreciated that in the above embodiment, the spring means S may be such that a spiral cantilever 19 is formed in the deformable metal plate 12 as shown in FIGS. 17–18, and a dome 19b that protrudes toward the insulative resin film 3 (upward in the figure) may be formed on the tip 19a of the cantilever 19, so that the dome 19b may be brought into contact with the insulative resin film 3. In this case, an escape hole 55 is formed in an area of the support board 2 corresponding to the cantilever 19 so that the cantilever 19 may flexibly deform. Even so configured, the durability of the IC socket 1 and the spring means S used for this IC socket 1 can be improved in a similar manner to the afore-described embodiment, while reducing the parts count for the IC socket 1 and facilitating parts control.

Figure 19:
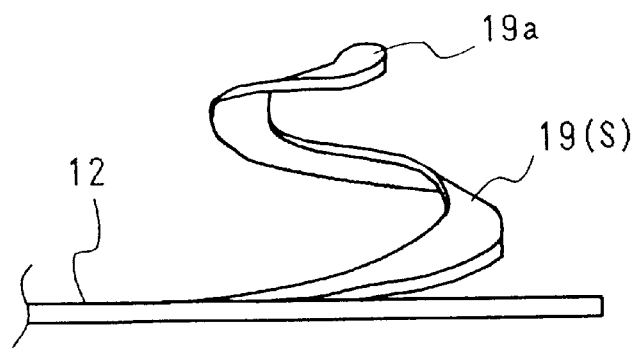
FIG. 19 is a front view of a metal plate having a spiral cantilever according to the first embodiment of the present invention.

Furthermore, in the above embodiment, the spring means S may be such that the spiral cantilever 19 is formed in the elastically deformable metal plate 12 as shown in FIG. 19, and this cantilever 19 is shaped so that its height increases toward its top, with the tip 19a of the cantilever 19 not being flat. Even so configured, a similar benefit to the afore-described embodiment can be obtained.

Second Embodiment

Figure 20:
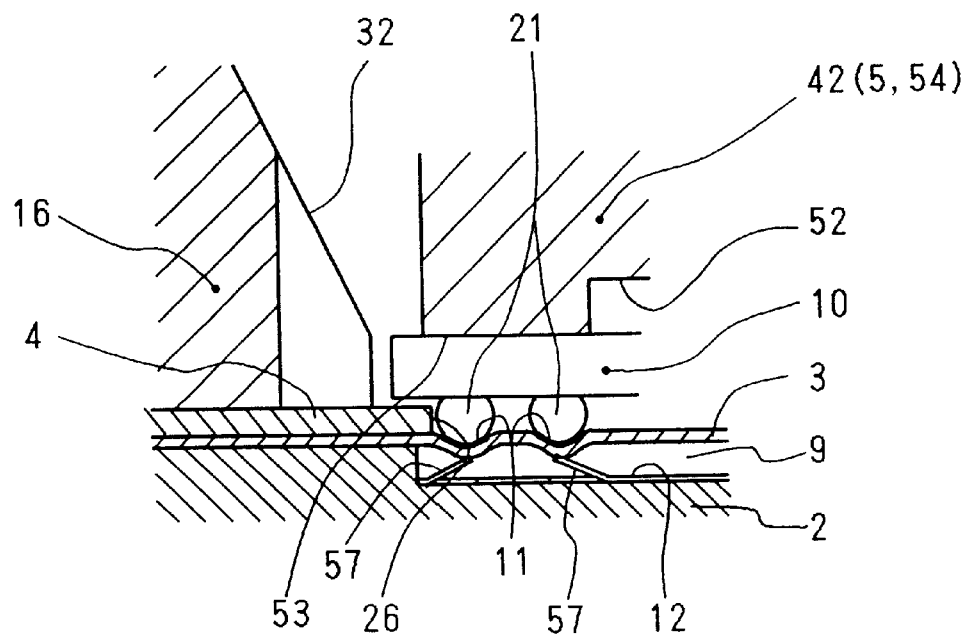
FIG. 20 is an enlarged view of principal portions of an IC socket, depicting a second embodiment of the present invention.
Figure 21:
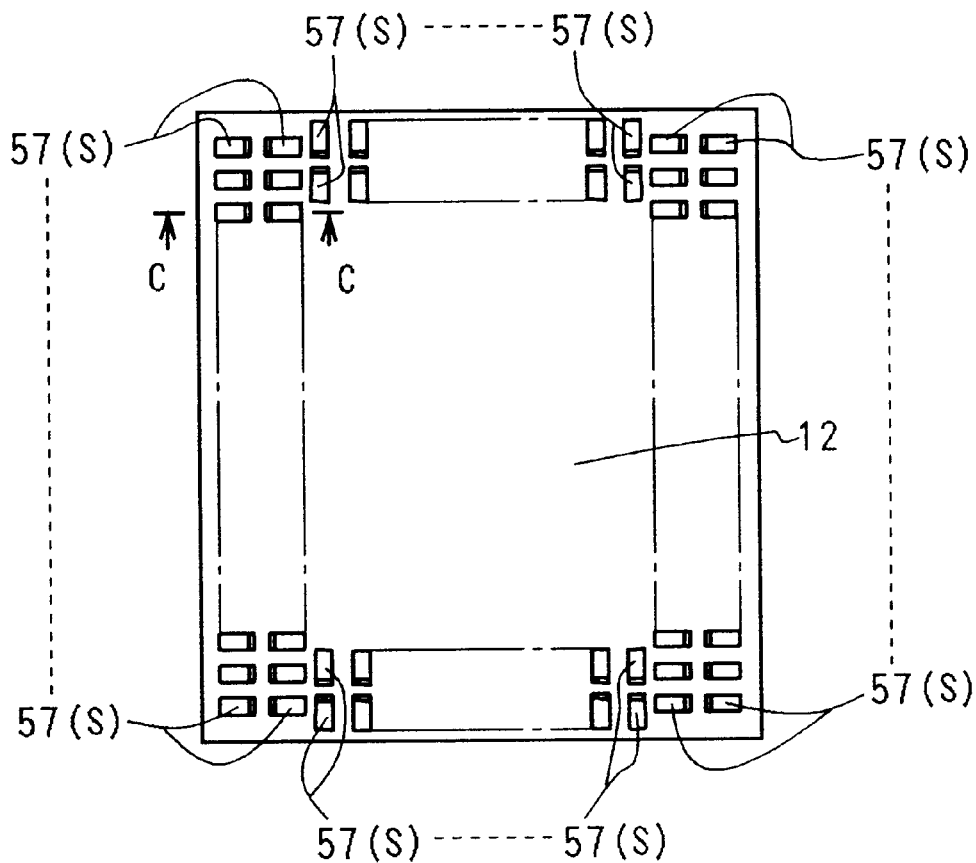
FIG. 21 is a plan view of a metal plate used in the IC socket.
Figure 22:
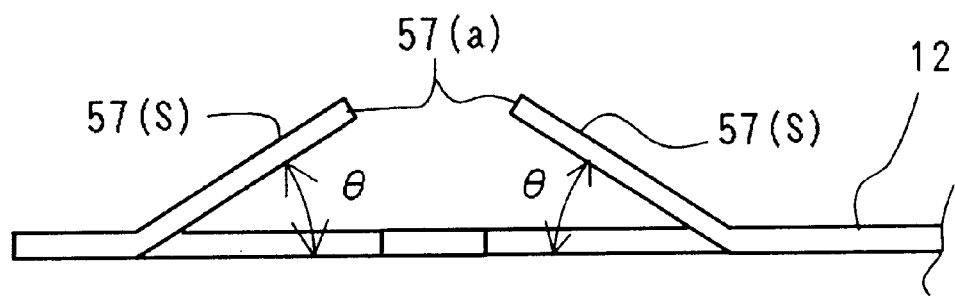
FIG. 22 is an enlarged cross-sectional view along line C—C of FIG. 21.

FIGS. 20–22 show a second embodiment of the present invention. As shown in those figures, with the present embodiment, spring means S is such that a plurality of plate-shaped cantilevers 57 are cut and raised from an elastically deformable metal plate 12 accommodated and fixed within a spring accommodating portion 9 of a support board 2 in correspondence with bumps 21 of an IC 10.

Further, the tips 57a of the cantilevers 57 press contact pads 11 against the burps 21 of the IC 10 via an insulative resin film 3. Here, for the spring means S, as shown in FIG. 21, where two rows of bumps 21 of the IC 10 are arranged on each of the sides by way of example, two vertical rows, right and left, of cantilevers 57 are cut and raised symmetrically so as to oppose each other (see FIGS. 20 and 22). Further, horizontal two: rows, top and bottom, of cantilevers 57, which are sandwiched between the two vertical rows, right and left, of cantilevers 57, are also cut and raised symmetrically so as to oppose each other.

According to the present embodiment so configured, in addition to a similar benefit to the first embodiment described above, the formation of the cantilevers 57 as the spring means S is simplified as compared to the above first embodiment.

Further, by cutting and raising two rows of cantilevers 57 so as to oppose each other, the tips 57a of the two rows of cantilevers 57 can be brought closer to each other, so that a shorter distance between the bumps 21 of the IC 10 can also be supported.

It should be appreciated that if the distance between the bumps 21 of the IC 10 is longer, two rows of cantilevers 57 may be cut and raised in the same direction, instead of cutting and raising two rows of cantilevers 57 so as to oppose each other. The angle, θ, at which the cantilever 57 is cut and raised from the metal plate 12 is determined as appropriate in consideration of the amount of flexible deformation of the cantilever 57, and other factors.

Third Embodiment

Figure 23:
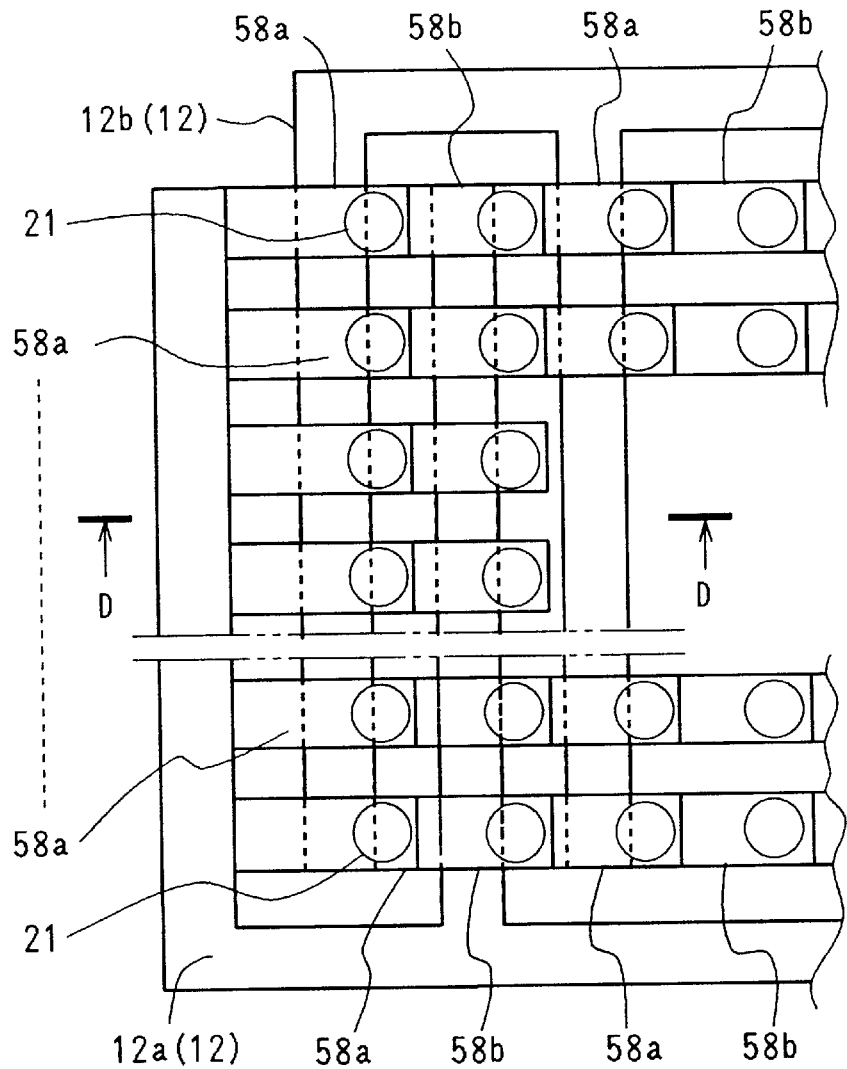
FIG. 23 is a plan view of a metal plate, depicting a third embodiment of the present invention.
Figure 24:
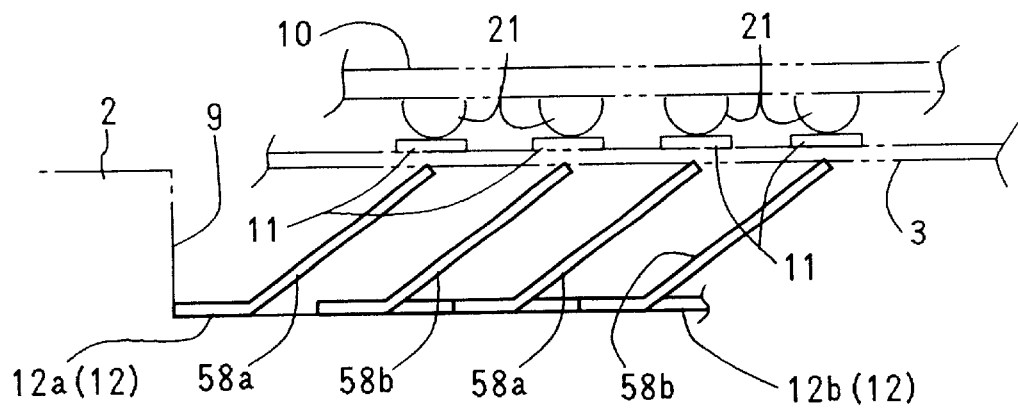
FIG. 24 is a cross-sectional view along line D—D of FIG. 23.
Figure 25:
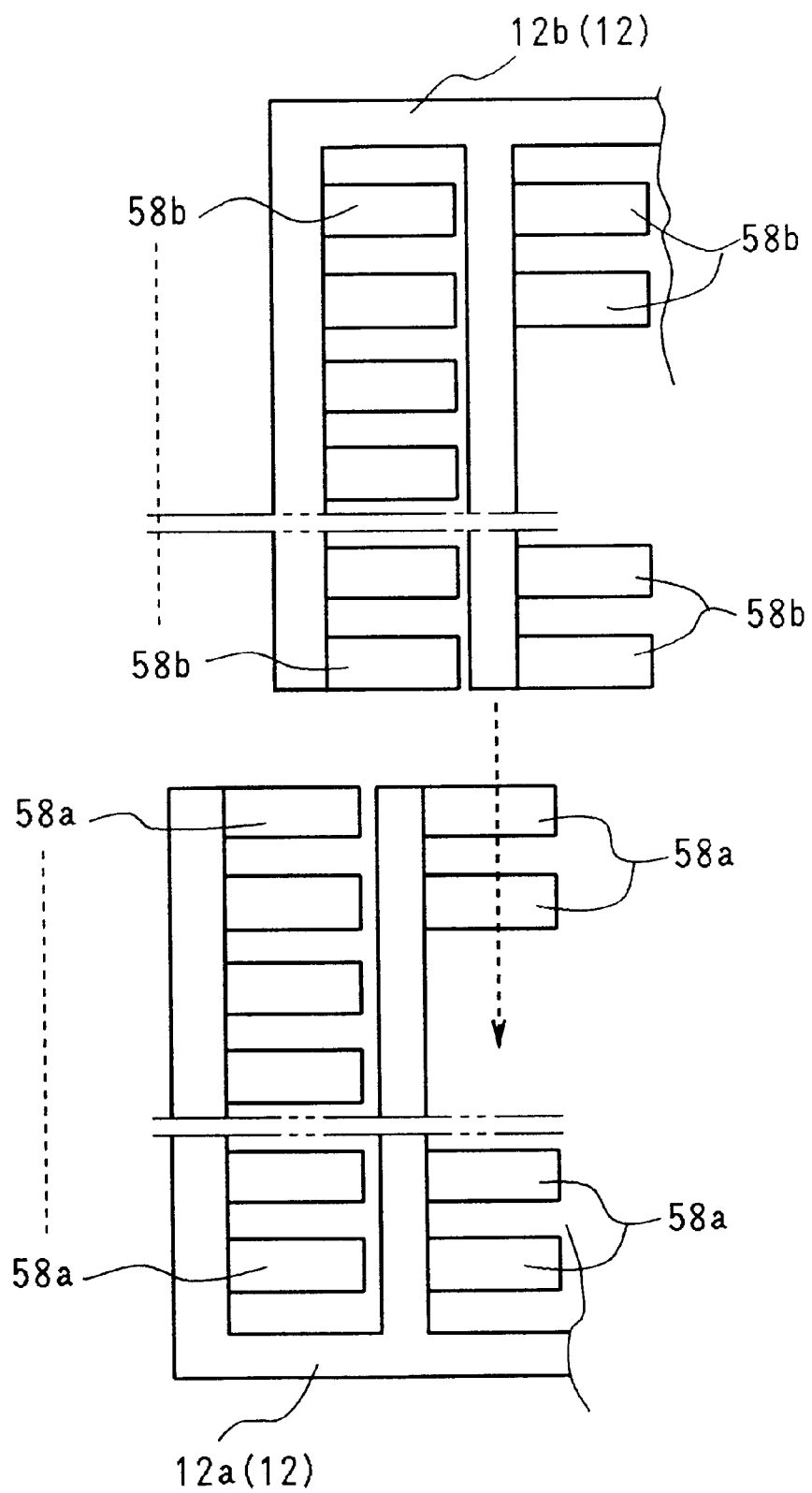
FIG. 25 is a plan view where the metal plate of FIG. 23 is separated into a first metal plate and a second metal plate.

FIGS. 23–25 show a third embodiment of the present invention. As shown in those figures, with the present embodiment, an elastically deformable metal plate 12 is comprised of a first metal plate 12a where odd rows of cantilevers 58a are formed and a second metal plate 12b where even rows of cantilevers 58b are formed. The first and second metal plates 12a and 12b are combined so that an even row of cantilevers 58b are positioned between adjacent odd rows of cantilevers 58a, and the first and second metal plates 12a and 12b are accommodated and fixed in a spring accommodating portion 9 of a support board 2. It should be appreciated that each of the cantilevers 58a and 58b has its tip located at a position corresponding to each of the bumps 21 of the IC 10, and this tip presses the contact pad 11 against the bump 21 of the IC 10 via the insulative resin film 3.

According to the present embodiment so configured, because ever rows of cantilevers of the second metal plate 12b are positioned between odd rows of cantilevers 58a of the first metal plate 12a, the distance between the cantilevers 58a and 58b can be reduced by half as compared to the case where cantilevers (58a or 58b) are formed in a single metal plate (12a or 12b). Thus, the present embodiment may be applied to electrical tests on ICs with narrower terminal-to-terminal pitches. Additionally, the present embodiment may, of course, provide a similar benefit to the above first embodiment.

Fourth Embodiment

Figure 26:
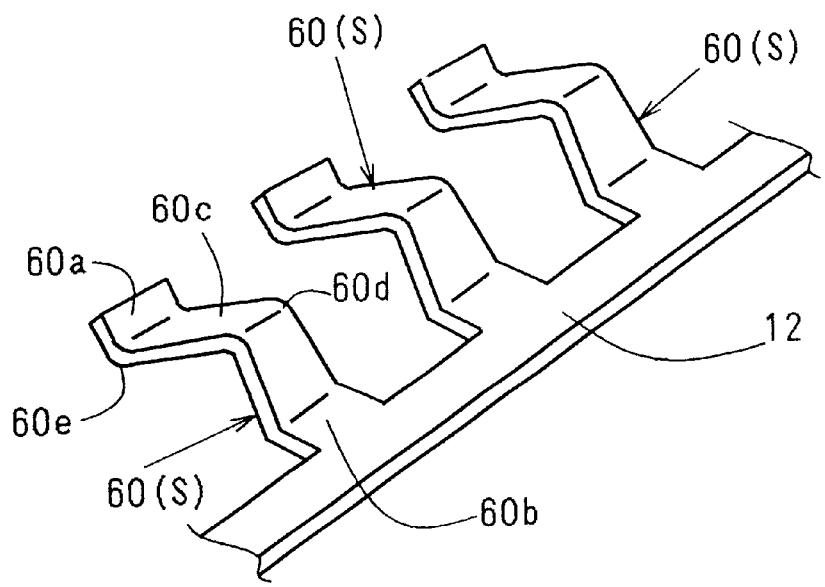
FIG. 26 is an external perspective view of principal portions of a metal plate, depicting a fourth embodiment of the present invention.
Figure 27:
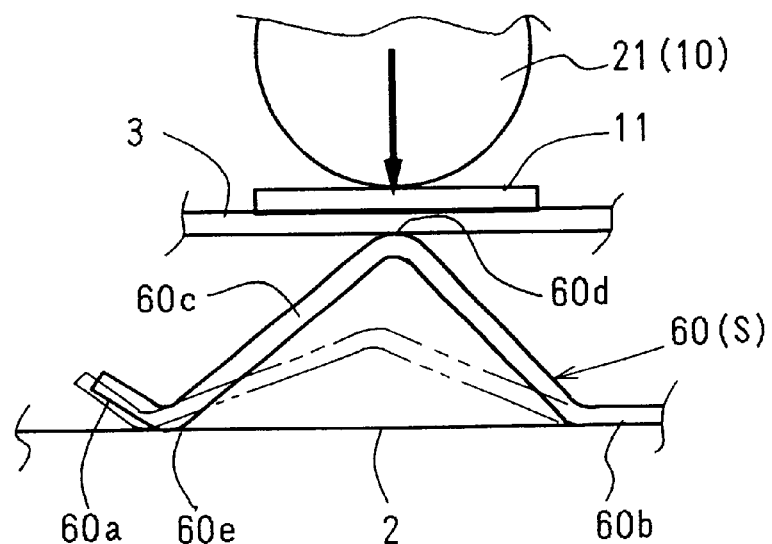
FIG. 27 is a partial enlarged view of an IC socket that uses the metal plate shown in FIG. 26.

FIGS. 26 and 27 show a fourth embodiment of the present invention. As shown in those figures, with the present embodiment, spring means S comprises a plate-shaped member 60 that is cut and raised from an elastically deformable metal plate 12, where a tip 60a of the plate-shaped member 60 is bent so that it can slide over a support board 2, and a curved portion 60c that protrudes upward is bent and formed between the root 60b and tip 60a thereof. This spring means S is such that a crest 60d of the curved portion 60c presses the contact pad 11 toward the bump 21 of the IC 10 via the insulative resin film 3. Further, as shown in FIG. 27, the tip 60a of the spring means S is bent in approximate "V" shape, so that the bottom 60e of this V-shaped portion slides over the support board 2.

More specifically, in the present embodiment, when the IC 10 is pressed downward by the IC pressure means (not shown), as shown in FIG. 27, the bump 21 of the IC 10 presses the curved portion 60c of the plate-shaped member 60 via the contact pad 11 and insulative resin film 3. As a result, the tip 60a of the plate-shaped member 60 slides leftward over the support board 2 in the figure, and the curved portion 60c of the plate-shaped member 60 elastically deforms as indicated by the alternate long and two short dashes line in the figure. And the deformation-resisting force of this plate-shaped member 60 acts between the bump 21 of the IC 10 and the contact pad 11, so that the bump 21 of the IC and the contact pad 11 are secure contacted. It should be appreciated that, in the present embodiment, when the plate-shaped member 60 deforms, the sliding resistance of the tip 60a of the plate-shaped member 60 is developed, so that the pressure developed between the bump 21 of the IC 10 and the contact pad 1 is greater than with a simple cantilever.

According to the present embodiment so configured, a similar benefit to the above first embodiment may be obtained That is, with the present embodiment, because the plate-shaped member 60 made of elastically deformable metal can cause a desired contact pressure to be developed between the bump 21 of the IC 10 and the contact pad 11, the durability of the IC socket and the spring means S used with this IC socket can be enhanced. Furthermore, with the present embodiment, because the plate-shaped member 60 is formed from the metal plate 12, the parts count for the spring means S can be reduced to facilitate parts control, as well as simplifying fabrication of the support board 2.

It should be appreciated that the present embodiment may be configured so that, when the metal plate 12 is fixed to the support board 2 as indicated by the dotted line in FIG. 27, the tip 60a of the plate-shaped member 60 is slightly separated from the support board 2, and when the contact pad 11 and insulative resin film 3 are slightly pressed downward by the bump 21 of the IC 10, the tip 60a of the plate-shaped member 60 contacts the support board 2. So Configured, the spring force of the plate-shaped member 60 acts in two steps. That is, while the tip 60a of the plate-shaped member 60 does not contact the support board 2, the plate-shaped member 60 acts like a cantilever, so that the deformation-resisting force of the plate-shaped member 60 is relatively small. However, after the plate-shaped member 60 contacts the support board 2, the sliding resistance developed between the tip 60a of the plate-shaped member 60 and the support board 2 is added, so that the deformation-resisting force of the plate-shaped member 60 is increased.

Fifth Embodiment

Figure 28:
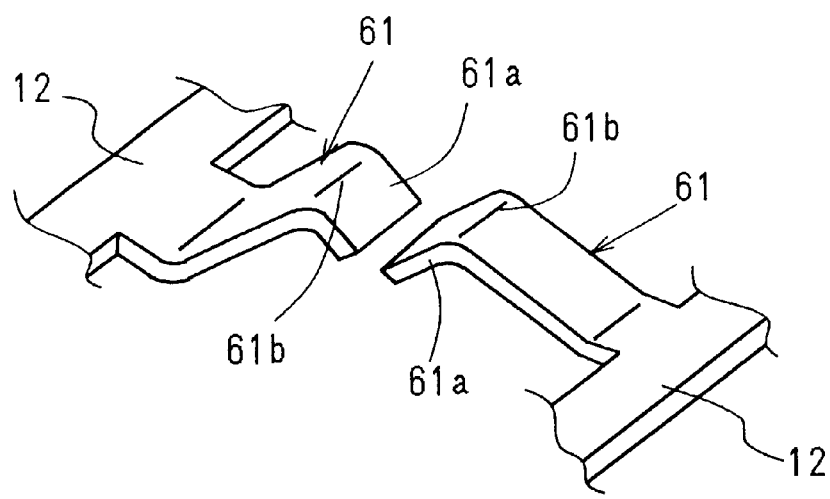
FIG. 28 is an external perspective view of principal portions of a metal plate, depicting a fifth embodiment of the present invention.
Figure 29:
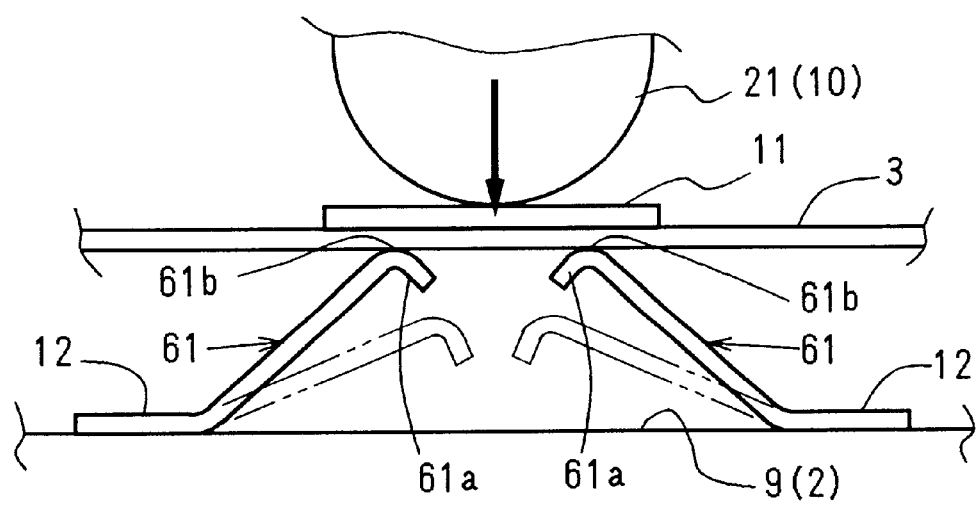
FIG. 29 is a partial enlarged view of an IC socket that uses the metal plate shown in FIG. 28.

FIGS. 28 and 29 show a fifth embodiment of the present invention. As shown in those figures, with the present embodiment, spring means S comprises a pair of cantilevers 61 cut and raised, so as to oppose each other, from an elastically deformable metal plate 12, and the tips 61a of the pair of cantilevers 61 are bent, so that the curved surface 61b at the crest of the bent portion supports the insulative resin film 3.

The spring means S of the present embodiment so configured is such that when the IC 10 is pressed downward in the figure by the IC pressure means (not shown), the pair of cantilevers 61 deform to a position indicated by the alternate long and two short dashes lines, and the resulting deformation-resisting force acts, via the insulative resin film 3, between the contact pad 11 and the bump 21. Thus, with the present embodiment, a similar benefit to the above first embodiment may also be achieved. It should be appreciated that, in the present embodiment, because the bump 21 is supported by a pair of cantilevers 61, the contact stability between the bump 21 and contact pad 11 is increased, with an increased contact pressure between the bump 21 and contact pad 11, as compared to the case where the bump 21 is supported by a single cantilever.

Sixth Embodiment

Figure 30:
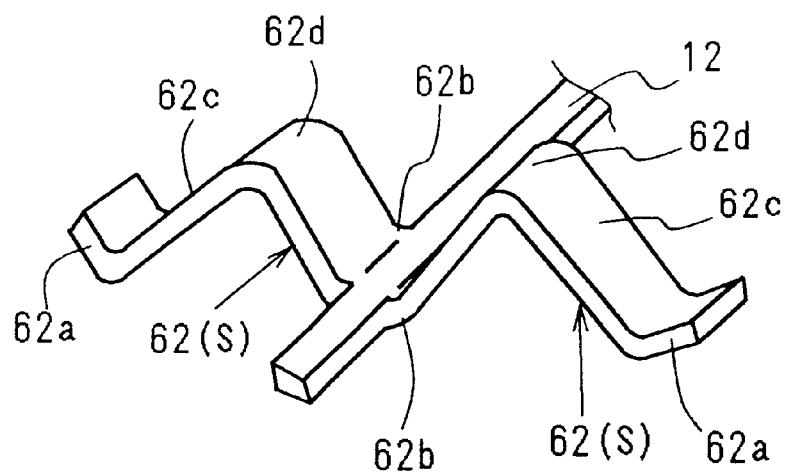
FIG. 30 is an external perspective view of principal portions of a metal plate, depicting a sixth embodiment of the present invention.
Figure 31:
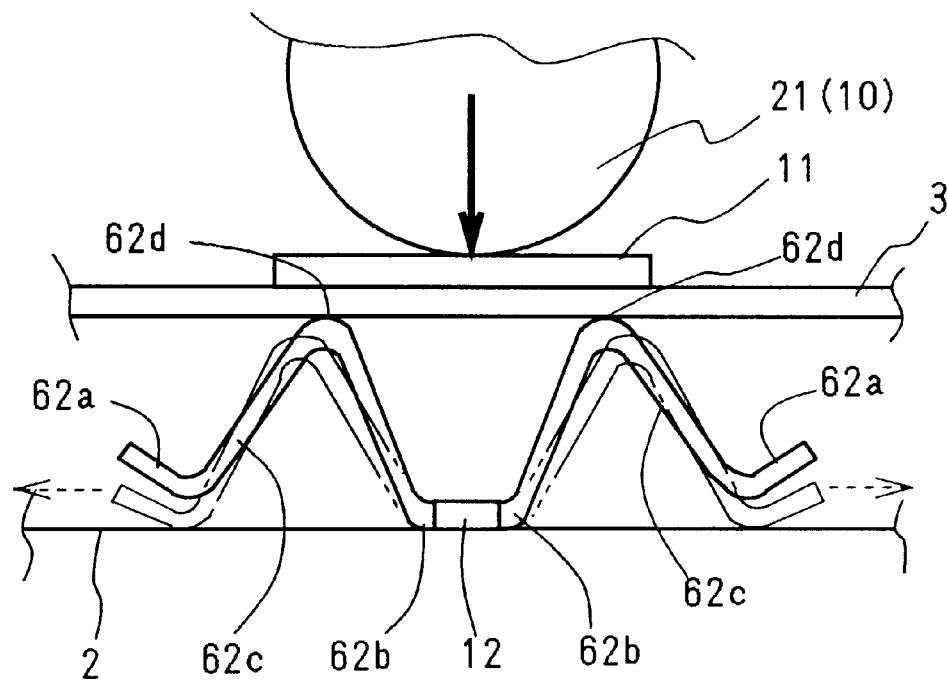
FIG. 31 is a partial enlarged view of an IC socket that uses the metal plate shown in FIG. 30.

FIGS. 30 and 31 show a sixth embodiment of the present invention. As shown in those figures, spring means S of the present embodiment is such that a pair of plate-shaped members 62 are cut and raised so as to extend in opposite directions, from an elastically deformable metal plate 12, and the tips 62a of these plate-shaped members 62 are bent so that curved portions 62c that protrude upward are formed between the tip 62a and root 62b. Further, the crests 62d of the curved portions 62c support the bump 21 of the IC 10 via the insulative resin film 3.

According to the present embodiment so configured, when the IC 10 is pressed downward in FIG. 31 by the IC pressure means (not shown), the crests 62d of the pair of plate-shaped members 62 are pressed downward via the insulative resin film 3. As a result, the pair of plate-shaped members 62 flexibly deform to a position indicated by the alternate long and two short dashes lines in FIG. 31, and the tips 62a are brought into contact with the support board 2. Subsequently, when the crests 62d of the curved portions 62c of the pair of plate-shaped members 62 is further pressed by the bump 21 of the IC 10, the tips 62a of the plate-shaped members 62 slide over the support board 2, so that the plate-shaped members 62 flexibly deform. Thus, the contact pressure between the bump 21 of the IC 10 and the cog tact pad 11 changes in two steps. That is, the plate-shaped members 62 act as cantilevers until their tips 62a are brought into contact with the support board 2, thereby developing a relatively small contact pressure between the bump 21 and contact pad 11. Next, when the tips 62a are brought into contact with the support board 2, frictional resistance is developed at the tips 62a, so that a relatively large contact pressure is developed between the bump 21 and contact pad 11.

Thus, with the present embodiment so configured, a similar benefit to the above first embodiment may also be achieved. It should be appreciated that because a pair of plate-shaped members 62 exert a spring action, the spring means S of the present embodiment develops a significant spring force as compared to the case where a single cantilever exerts a spring action.

It should be appreciated that, in the present embodiment, the metal plate 12 may be fixed onto the support board 2 with the tips 62a of the plate-shaped members 62 contacted onto the support board 2, instead of separating the tips 62a of the plate-shaped portions 62 from the support board 2.

Seventh Embodiment

Figure 32A:
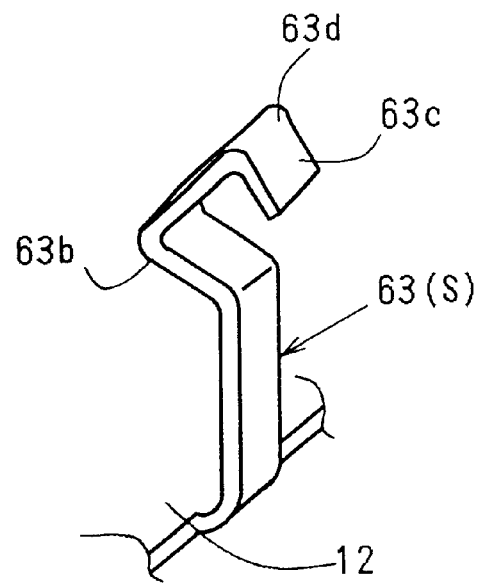
FIG. 32A is an external perspective view depicting a metal plate according to a seventh embodiment of the present invention.
Figure 32B:
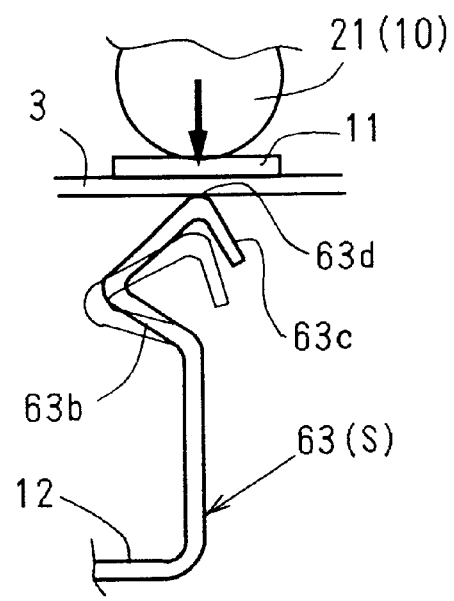
FIG. 32B is a partial enlarged view of an IC socket that uses the metal plate according to the seventh embodiment of the present invention.

FIGS. 32A and 32B show a seventh embodiment of the present invention. As shown in these FIGS. 32A and 32B, spring means S of the present embodiment comprises a plate-shaped member 63 that is cut and raised from an elastically deformable metal plate 12, and consists of a raised portion 63a that is bent upward (toward the insulative resin ills film 3) in the figure, and a spring action portion 63b that extends further upward beyond the raised portion 63a. The tip 63c of the spring action portion 63b is bent downward aslant, and the curved surface of the crest 63d of the tip 63c supports the insulative resin film 3.

The spring action portion 63b of the plate-shaped member 63 is bent in approximate "<" shape, and when the IC 10 is pressed downward in the figure by the IC pressure means (not shown), the spring action portion 63b of the plate-shaped member 63 flexibly deform as indicated by the alternate long and two short dashes line in the figure, and presses the contact pad 11 toward the bump 21 of the IC 10 via the insulative resin film 3. Thus, the present embodiment may also offer a similar benefit to the above first embodiment.

It should be appreciated that the spring action portion 63b of the plate-shaped member 63 is not restricted to those aspects of the invention where it is bent in approximate "<" shape, but may be formed in an arc, wherein the insulative resin film 3 may be supported by the crest of the arc.

Eighth Embodiment

Figure 33:
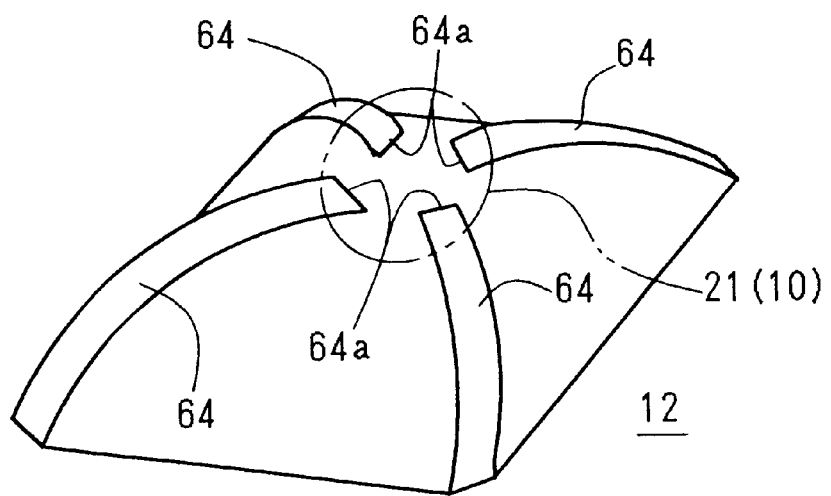
FIG. 33 is an external perspective view of principal portions of a metal plate, depicting an eighth embodiment of the present invention.

FIG. 33 shows an eighth embodiment of the present invention. As shown in FIG. 33, spring means S of the present embodiment is comprised of four cantilevers 64 that are cut and raised from an elastically deformable metal plate 12, where the four cantilevers 64 are all formed so as to extend upward toward their tips, and the tips of the four cantilevers 64 are brought closer to each other. And the tips 64a of the four cantilevers 64 support the bump 21 of the IC 10 via the insulative resin film and contact pad (not shown).

According to the present embodiment so configured, because the tips 64a of the four cantilevers 64 support the bump 211 of the IC 10, the contact stability of the bump 21 of the IC 10 is improved. Additionally, the present embodiment may also offer a benefit similar to the above first embodiment.

It should be appreciated that the four cantilevers 64 are curved in an arc in the figure, although they are not restricted thereto, and may also be formed in the shape of a approximately straight line. Additionally, the number of cantilevers is not restricted to four, but three cantilevers or five or more cantilevers may also be formed.

Ninth Embodiment

Figure 34:
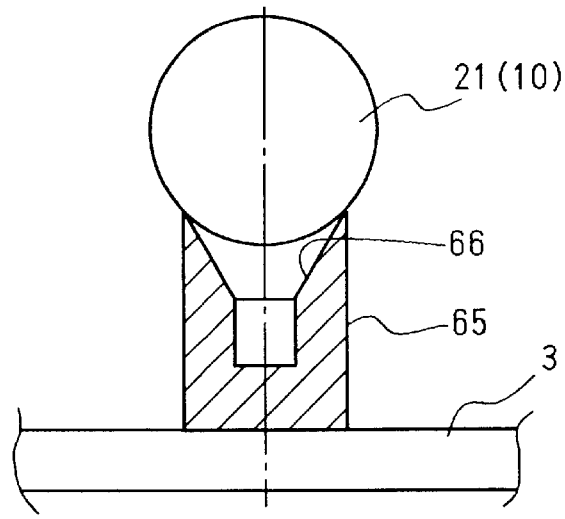
FIG. 34 is a cross-sectional view of a contact pad, depicting a ninth embodiment of the present invention.

FIG. 34 shows a ninth embodiment of the present invention. As shown in FIG. 34, the present embodiment is configured so that an increasingly tapered surface 66 with an opening at top thereof is formed in a contact pad 65, and this tapered surface 66 supports the bump 21 of the IC 10.

Figure 35A:
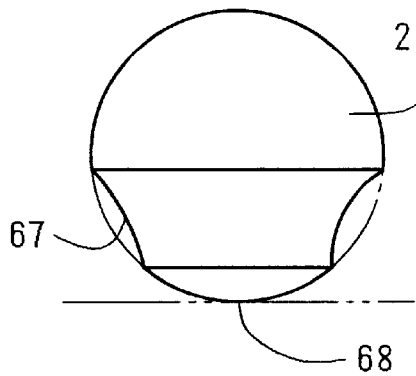
FIG. 35A is a view depicting the state where the IC bump is deformed, i.e., an example of bump deformation where the contact pad of FIG. 34 is used.
Figure 35B:
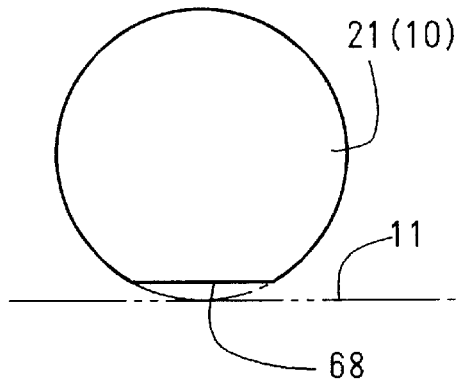
FIG. 35B is a view depicting the state where the IC bump is deformed, i.e., an example of bump deformation where a planar contact pad is used.

According to the present embodiment so configured, the bump 21 of the IC 10 deforms on a side 64 where it contacts the contact pad 65, as shown in FIG. 35A, but its bottom 68 remains unchanged. On the other hand, if the contact pad 11 is flat, the bottom 68 of the bump 21 of the IC 10 deforms as a dent when the contact pressure between the bump 21 of the IC 10 and the contact pad 11 is significant (see FIG. 35B). Thus, if the deformation of the bump 21 as shown in FIG. 35B is not acceptable, the contact pad 65 of the present embodiment may preferably be used.

Figure 36:
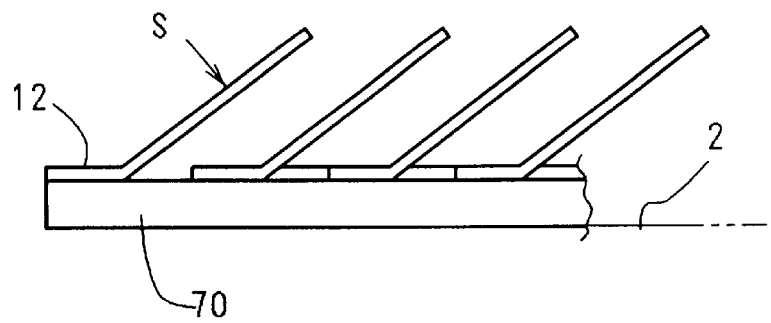
FIG. 36 is a view depicting an example where the metal plate of the present invention is attached.
Figure 37:
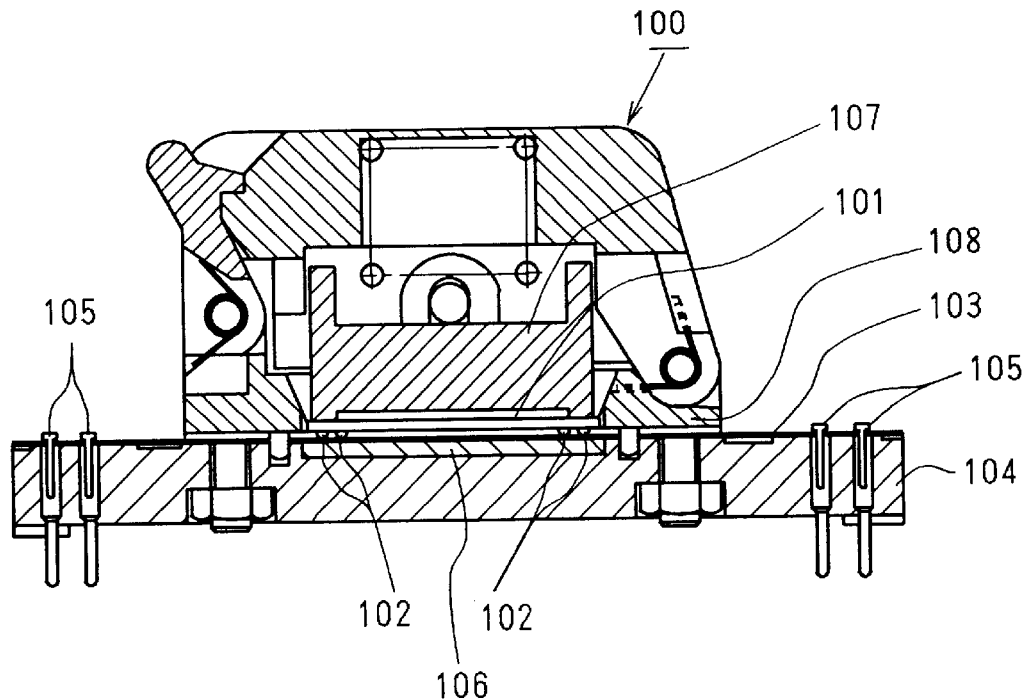
FIG. 37 is a cross-sectional view of a prior art IC socket.
Figure 38:
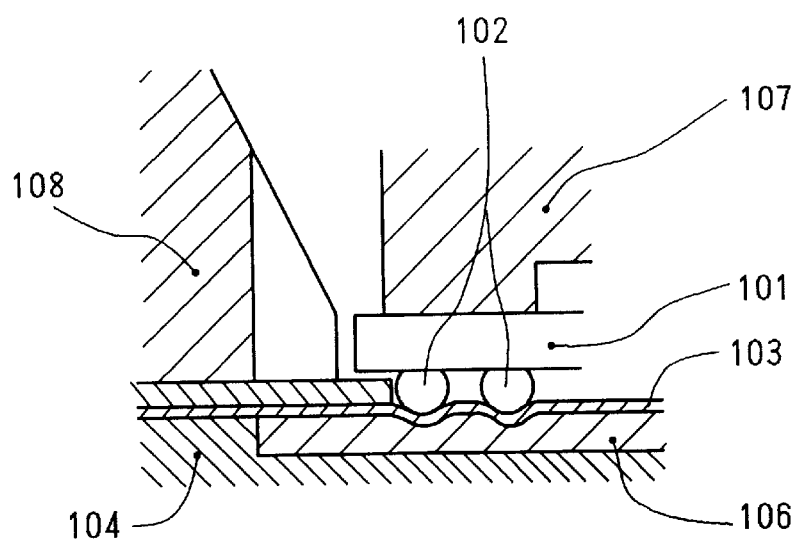
FIG. 38 is a partial enlarged view of FIG. 37.

It should be appreciated that in each of the above embodiments, the elastically deformable metal plate 12 may be fixed to the support board via a silicone rubber plate 70, as shown in FIG. 36. In so doing, with the cover 31 closed (see FIGS. 10 and 11), if the cover 31 is pushed in beyond the engaged positions of the hook 37 and stepped portion 36, the excess amount of the cover 31 pushed in may be absorbed by the deformation of the silicone rubber plate 70, so that the spring means S will not be overloaded.

Furthermore, the spring means S need not be installed in one-to-one correspondence with each contact pad, but may correspond to every other contact pad.

The above second through eighth embodiments depict other aspects of the spring means S that comprises the IC socket according to the first embodiment of the invention. Thus, the spring means S disclosed in the second through eighth embodiments may be used with the IC socket 1 in place of the spring means S of the first embodiment.

As described above, the present invention is configured so that spring means, such as a plate-shaped member(s) or cantilever(s), is formed in an elastically deformable metal plate, and the tip of this spring means supports the insulative resin film; as such, when the IC is pressed by the IC pressure means and the IC terminal flexibly deforms the spring means via the insulative resin film, a contact pressure due to the elastic force of the spring means is developed at the, contact area between the terminal and contact pad, so that electrical tests on the IC can be performed accurately over a long period of time, as compared to a prior art example where a silicone rubber plate provides a contact pressure between the bump and contact pad.

We claim:

1. An IC socket comprising:
    an insulative resin film that is elastically deformable, where a plurality of conductive contact pads are formed so as to correspond to a plurality of IC terminals and a circuit pattern is formed to electrically connect said contact pads and an external electrical test circuit;
    a support board for supporting a surface opposite to a surface where said contact pads of the insulative resin film are formed;
    an IC pressing means, attached to said support, for pressing the IC terminals to the contact pads of said insulative resin film; and
    a spring means for pressing said contact pads against said IC terminals pressed by said IC pressing means;
    wherein said spring means comprises a spiral cantilever formed of a part of an elastically deformable metal plate fixed to a surface of said support board facing said insulative resin film; and
    wherein a tip of said spiral cantilever presses said contact pads against said IC terminals via said insulative resin film.

2. The IC socket according to claim 1, wherein said spiral cantilever is formed so that its height increases toward its tip.

3. The IC socket according to claim 2, wherein said spiral cantilever has its top formed to be flat.

4. An IC socket spring means for use with an IC socket, said IC socket comprising:
    an insulative resin film that is elastically deformable, where a plurality of conductive contact pads are formed so as to correspond to a plurality of IC terminals and a circuit pattern is formed to electrically connect said contact pads and an external electrical test circuit;
    a support board for supporting a surface opposite to a surface where said contact pads of the insulative resin film are formed; and an IC pressing means, attached to said support board, for pressing the IC terminals to the contact pads of said insulative resin film;

said IC socket spring means pressing said contact pads against said IC terminals pressed by said IC pressing means;

wherein a spiral cantilever is formed of a part of an elastically deformable metal plate fixed to a surface of said support board facing said insulative resin film, and a tip of the spiral cantilever presses said contact pads against said IC terminals via said insulative resin film.

5. The IC socket spring means according to claim 4, wherein said spiral cantilever is formed so that its height increases toward its tip.

6. The IC socket spring means according to claim 4, wherein said spiral cantilever has its top formed to be flat.

7. An IC socket comprising:

an elastically deformable insulating resin film having a plurality of conductive contact pads formed so as to correspond to a plurality of IC terminals, said resin film-having a circuit pattern formed so as to electrically connect said contact pads and an external electrical test circuit;

a support board for supporting thereon said resin film, said support board having a recessed portion for defining a space between said resin film and a bottom of said recessed portion;

IC pressing means for pressing said IC terminals against said contact pads of said resin film;

an elastically deformable metal plate received in said recessed portion and fixed to said bottom of said recessed portion so as to face said resin film; and spring means for pressing said contact pads against said IC terminals, said spring means being associated with said IC pressing means for elastically holding said IC terminals and said contact pads, said spring means being a spiral cantilever formed of a part of said elastically deformable metal plate so that a tip of said spiral cantilever presses said contact pads against said IC terminals via said resin film.

8. The IC socket according to claim 7, wherein said spiral cantilever is formed so as to spirally extend to said resin film.

9. The IC socket according to claim 7, wherein said tip of said spiral cantilever has a flat face.

10. The IC socket according to claim 7, wherein said recessed portion is a rectangular portion.

11. An IC socket comprising:

an elastically deformable insulating resin film having a plurality of conductive contact pads formed so as to correspond to a plurality of IC terminals, said resin film having a circuit pattern formed so as to electrically connect said contact pads and an external electrical test circuit;

a support board for supporting thereon said resin film, said support board having a recessed portion for defining a space between said resin film and a bottom of said recessed portion;

IC pressing means for pressing said IC terminals against said contact pads of said resin film;

an elastically deformable metal plate received in said recessed portion and fixed to said bottom of said recessed portion so as to face said resin film; and a plurality of spiral cantilevers for pressing said contact pads against said IC terminals, said spiral cantilevers being associated with said IC pressing means for elastically holding said IC terminals and said contact pads, said spiral cantilevers being formed of a part of said elastically deformable metal plate so that tips of said spiral cantilevers presses said contact pads against said IC terminals via said resin film.

12. The IC socket according to claim 11, wherein each of said spiral cantilevers is formed so as to spirally extending to said resin film.

13. The IC socket according to claim 11, wherein each of said tips of said spiral cantilevers has a flat face.

14. The IC socket according to claim 11, wherein said recessed portion is a rectangular portion.

* * * * *